(12) United States Patent
Ozawa

(10) Patent No.: US 8,092,960 B2
(45) Date of Patent: Jan. 10, 2012

(54) EXPOSING MASK AND PRODUCTION METHOD THEREFOR AND EXPOSING METHOD

(75) Inventor: Ken Ozawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 149 days.

(21) Appl. No.: 12/247,972

(22) Filed: Oct. 8, 2008

(65) Prior Publication Data

US 2009/0044166 A1 Feb. 12, 2009

Related U.S. Application Data

(62) Division of application No. 10/508,074, filed as application No. PCT/JP2004/000778 on Jan. 28, 2004, now abandoned.

(30) Foreign Application Priority Data

| Jan. 28, 2003 | (JP) | P2003-018439 |
| Mar. 28, 2003 | (JP) | P2003-089710 |
| Jul. 16, 2003 | (JP) | P2003-275123 |
| Nov. 13, 2003 | (JP) | P2003-383301 |
| Jan. 15, 2004 | (JP) | P2004-007624 |

(51) Int. Cl.
*G03F 1/00* (2006.01)
*G03C 5/00* (2006.01)
*G06F 17/50* (2006.01)

(52) U.S. Cl. .................. 430/5; 430/30; 716/55
(58) Field of Classification Search ............... 430/5, 30
See application file for complete search history.

(56) References Cited

U.S. PATENT DOCUMENTS

| 5,308,741 | A | 5/1994 | Kemp |
| 5,465,220 | A | 11/1995 | Haruki et al. |
| 5,635,285 | A | 6/1997 | Bakeman, Jr. et al. |
| 5,776,639 | A | 7/1998 | Umeki et al. |
| 6,001,512 | A | 12/1999 | Tzu et al. |
| 6,178,035 | B1 | 1/2001 | Eda |
| 6,335,151 | B1 | 1/2002 | Ausschnitt et al. |
| 6,475,684 | B2 * | 11/2002 | Ki ............................ 430/30 |
| 2001/0028983 | A1 | 10/2001 | Kawamura |
| 2002/0166107 | A1 | 11/2002 | Capodicci et al. |

(Continued)

FOREIGN PATENT DOCUMENTS

EP 1 246 010 10/2002
(Continued)

OTHER PUBLICATIONS

Japanese Office Action dated Jul. 8, 2008.

(Continued)

*Primary Examiner* — Mark F Huff
*Assistant Examiner* — Jonathan Jelsma
(74) *Attorney, Agent, or Firm* — SNR Denton US LLP

(57) ABSTRACT

An exposure mask forms a three-dimensional shape in simple structure and obtainable sufficient number of gray scales by exposure. In an exposure mask (M) for use in an exposure apparatus (S), the present invention is provided such that a plurality of pattern blocks constituted by a pair of a light blocking pattern blocking light emitted from the exposure apparatus (S) and a transmissive pattern transmitting the light are continuously arranged while a pitch of the continuous pattern blocks is constant and a ratio of the light blocking pattern to the transmissive pattern is varied gradually.

5 Claims, 26 Drawing Sheets

U.S. PATENT DOCUMENTS

| | | |
|---|---|---|
| 2003/0068565 A1* | 4/2003 | Ki et al. ............ 430/5 |
| 2003/0101421 A1 | 5/2003 | Satoh |
| 2005/0026050 A1 | 2/2005 | Ozawa et al. |
| 2005/0130045 A1 | 6/2005 | Ozawa |

FOREIGN PATENT DOCUMENTS

| | | |
|---|---|---|
| JP | 08-504515 | 6/1994 |
| JP | 07-230159 | 8/1995 |
| JP | 2001-147515 | 5/2001 |
| JP | 2001-230180 | 8/2001 |
| JP | 2002-099070 | 4/2002 |
| JP | 2002-311565 | 10/2002 |
| JP | 2003-315507 | 11/2003 |
| WO | 00/72090 | 11/2000 |

OTHER PUBLICATIONS

European Search Report dated Jul. 27, 2006.
European Search Report dated Apr. 16, 2006.
Kirk, Joseph P., "Scattered Light in Photolithographic Lenses", Optical laser Microlithography, VII 2-4, Mar. 1994.
Bourov, A. et al., "Impact of Flare on CD Variation for 248 Nm Lithography Systems", Proceedings of SPIE, Bellingham, VA, vol. 4346, Sep. 2001.

* cited by examiner

PB, L, P, PB, PB, PB1, PB2, ELEMENT CENTER (CENTER OF SITE 0), BOUNDARIES BETWEEN ADJACENT ELEMENTS, PB2 PB1, CENTER OF SITE N

PITCH = P

| Y\X | X0 | X1 | X2 | ... | Xn |
|-----|-----|-----|-----|-----|-----|
| Y0 | T(P,X0,Y0) | T(P,X1,Y0) | T(P,X2,Y0) | ... | T(P,Xn,Y0) |
| Y1 | T(P,X0,Y1) | T(P,X1,Y1) | T(P,X2,Y1) | ... | T(P,Xn,Y1) |
| Y2 | T(P,X0,Y2) | T(P,X1,Y2) | T(P,X2,Y2) | ... | T(P,Xn,Y2) |
| Y3 | T(P,X0,Y3) | T(P,X1,Y3) | T(P,X2,Y3) | ... | T(P,Xn,Y3) |
| Y4 | T(P,X0,Y4) | T(P,X1,Y4) | T(P,X2,Y4) | ... | T(P,Xn,Y4) |
| : | : | : | : | : | : |
| Yn | T(P,X0,Yn) | T(P,X1,Yn) | T(P,X2,Yn) | ... | T(P,Xn,Yn) |

FIG.11
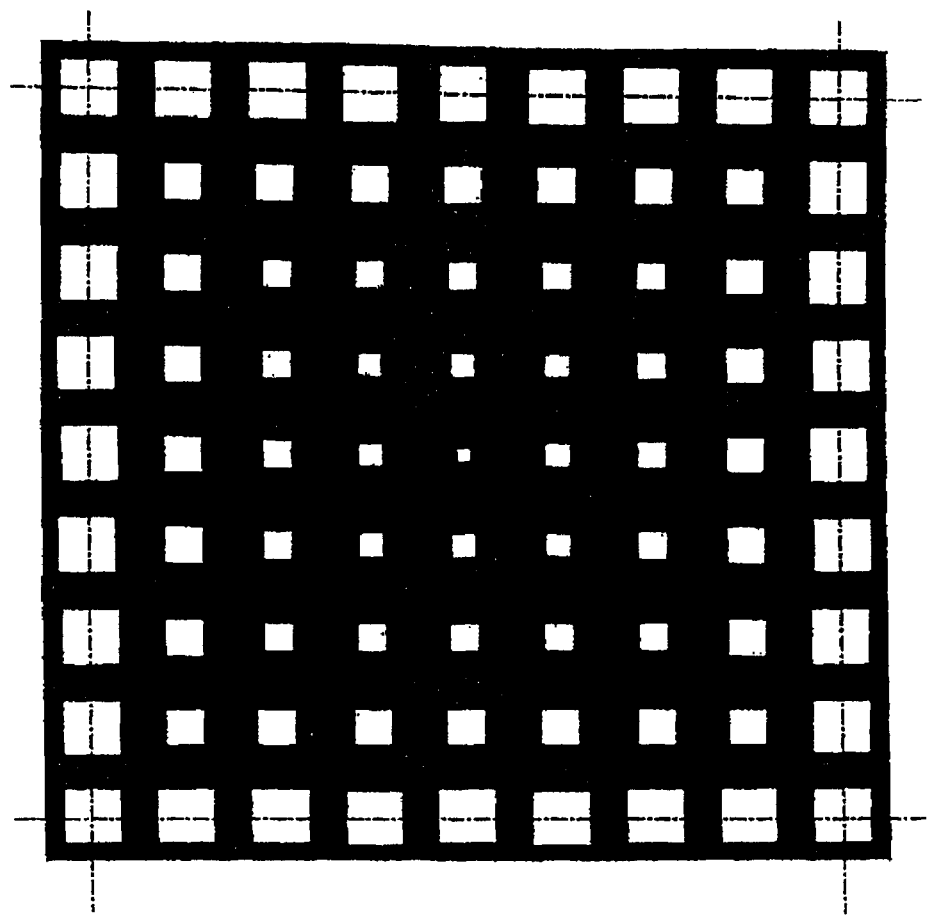
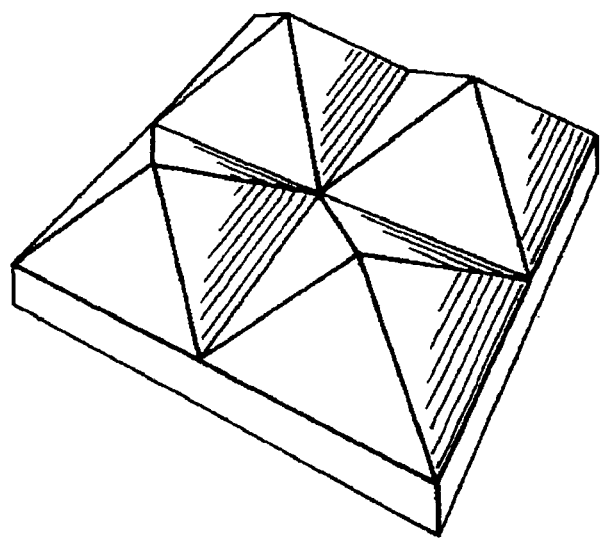

FIG.12
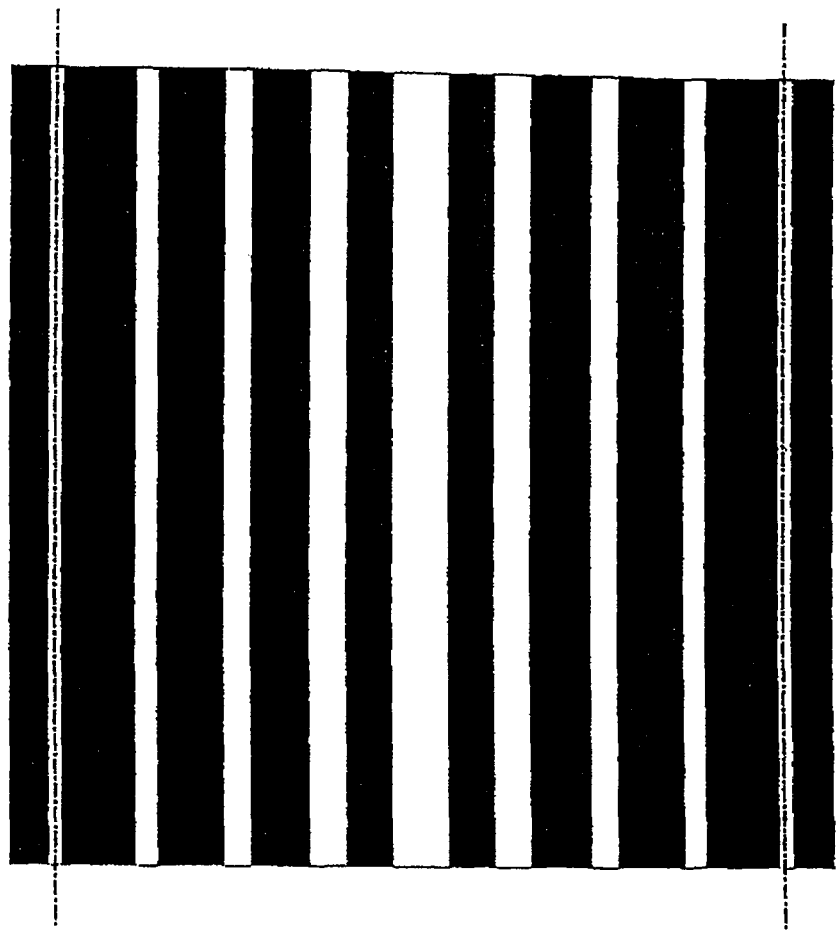
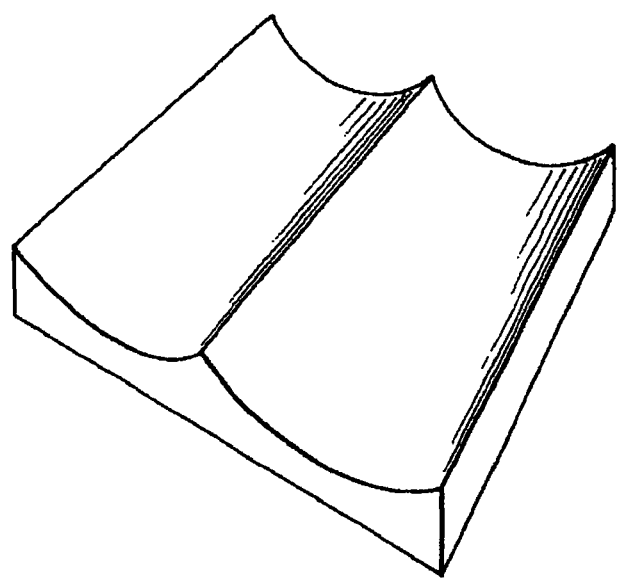

MASK Mx

MASK My

SHAPE FORMED
WITH MASK Mx

SHAPE FORMED
WITH MASK My

SHAPE FORMED BY
TWO EXPOSURES
WITH MASK Mx AND My

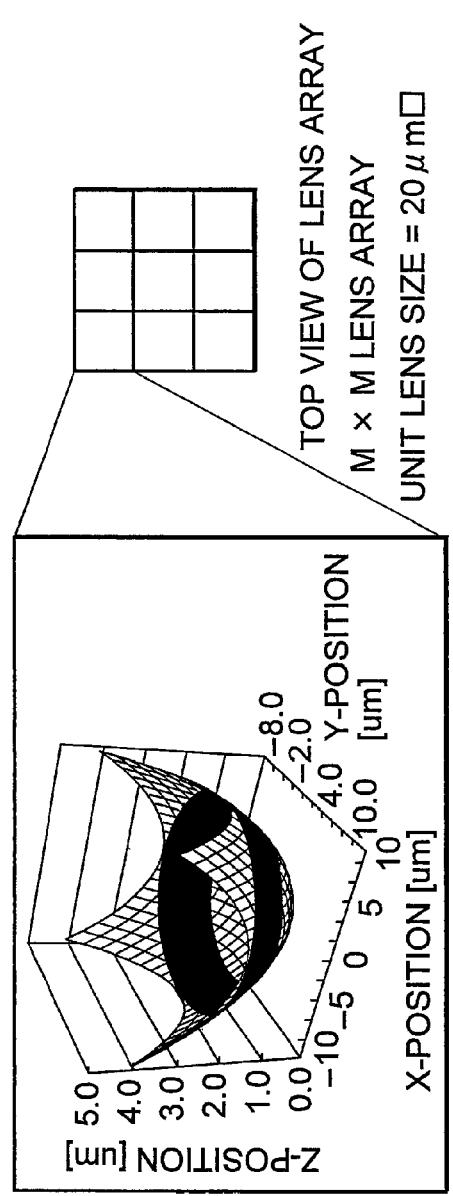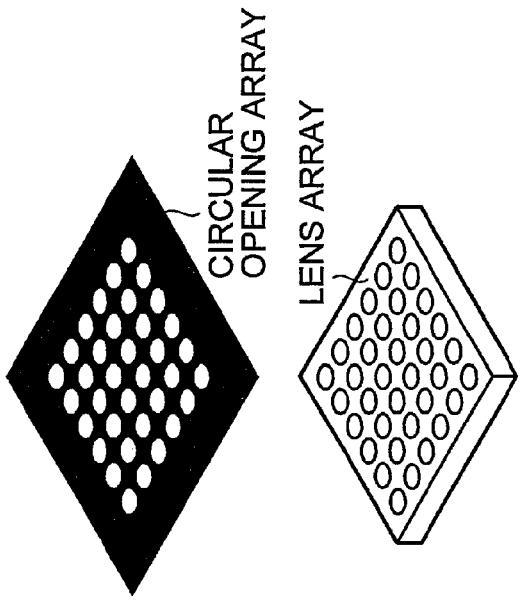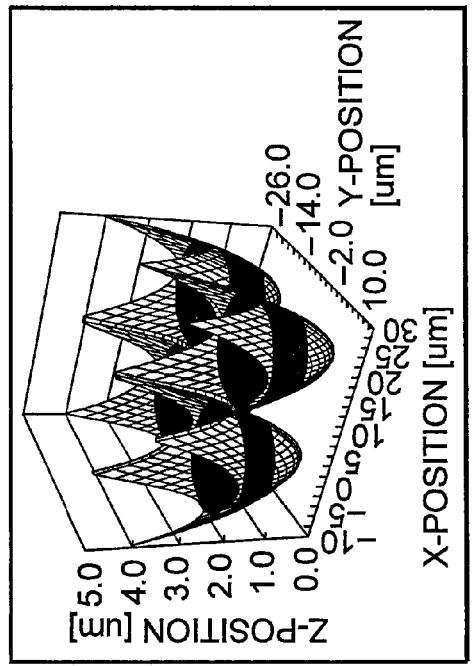

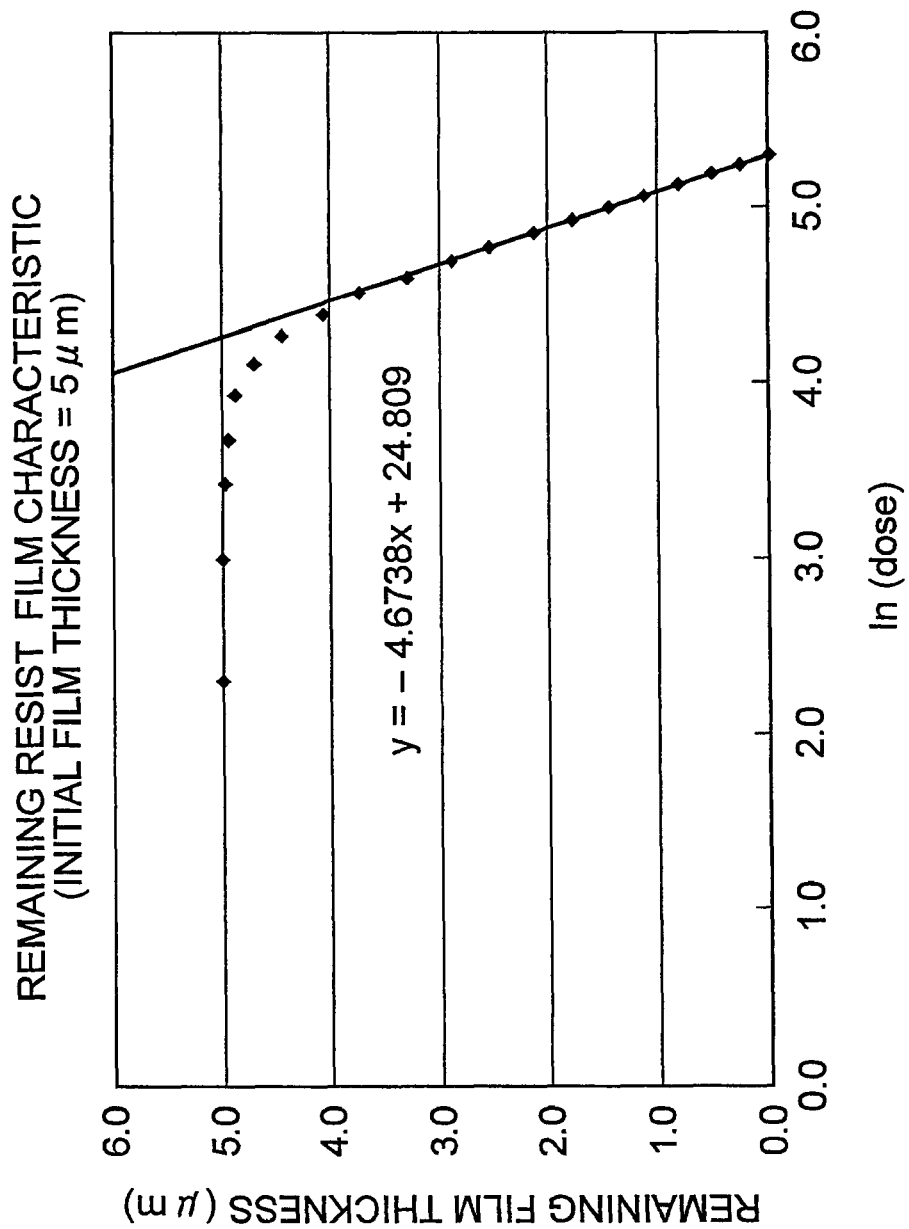

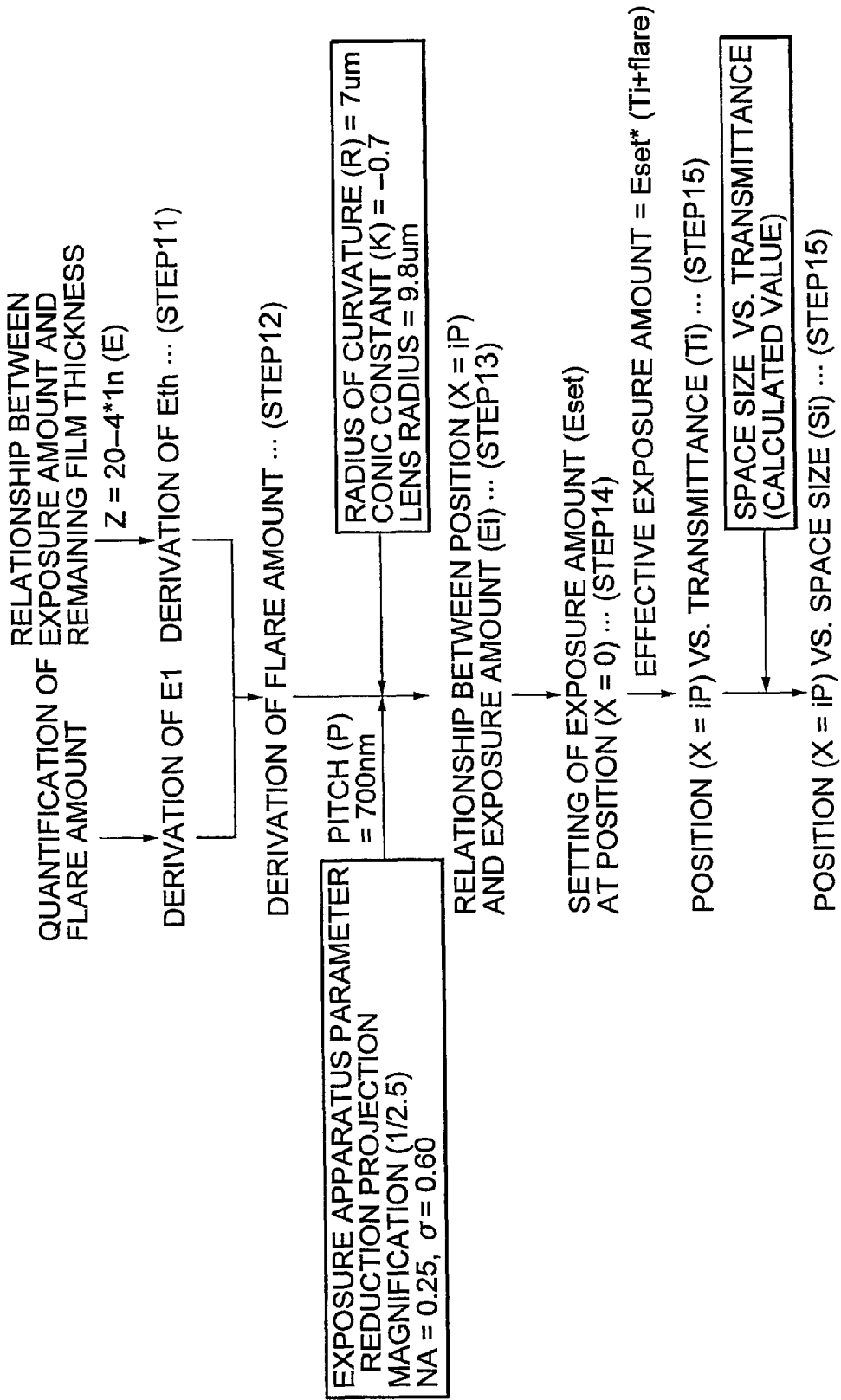

UNIT: nm (ON WAFER)

| IMAGE HEIGHT | FLARE 0% | FLARE 3% |
|---|---|---|
| 0 | 540 | 540 |
| 700 | 538 | 538 |
| 1400 | 531 | 530 |
| 2100 | 519 | 518 |
| 2800 | 503 | 501 |
| 3500 | 482 | 480 |
| 4200 | 459 | 455 |
| 4900 | 432 | 426 |
| 5600 | 402 | 394 |
| 6300 | 370 | 359 |
| 7000 | 335 | 322 |
| 7700 | 300 | 282 |
| 8400 | 263 | 241 |
| 9100 | 227 | 198 |
| 9800 | 190 | 152 |

FIG. 27A  COATING OF SUBSTRATE WITH RESIST (≤10μ)
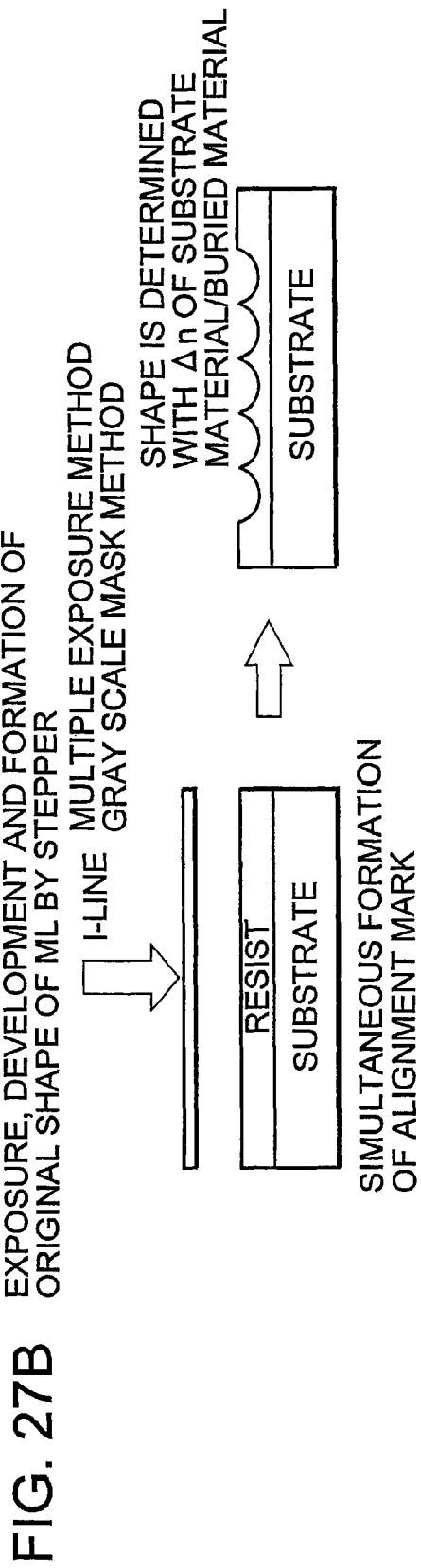
FIG. 27B  EXPOSURE, DEVELOPMENT AND FORMATION OF ORIGINAL SHAPE OF ML BY STEPPER
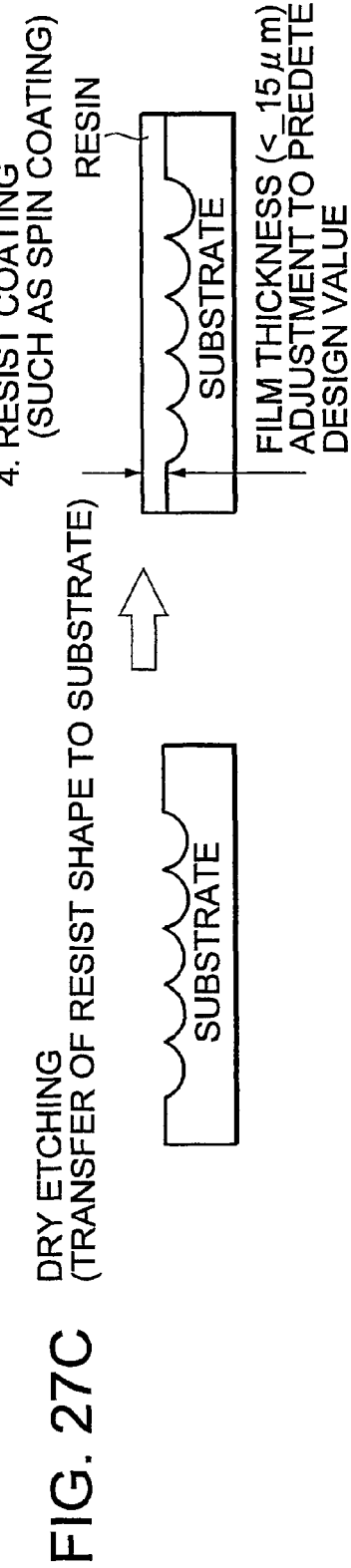
FIG. 27C  DRY ETCHING (TRANSFER OF RESIST SHAPE TO SUBSTRATE)

EXPOSING MASK AND PRODUCTION METHOD THEREFOR AND EXPOSING METHOD

RELATED APPLICATION DATA

This application is a division of and claims priority to U.S. patent application Ser. No. 10/508,074, filed Sep. 16, 2004 now abandoned. Application Ser. No. 10/508,074 is incorporated herein by reference in its entirety. U.S. patent application Ser. No. 10/508,074 is the Section 371 National Stage of PCT/JP2004/000778, filed Jan. 28, 2004 and claims priority to the following Japanese Patent applications: 2004-007624, filed Jan. 15, 2004; 2003-383301, files Nov. 13, 2003; 2003-275123, filed Jul. 16, 2003; 2003-089710, filed Mar. 28, 2003; and 2003-018439, filed Jan. 28, 2003.

BACKGROUND OF THE INVENTION

The present invention relates to an exposure mask for forming a three-dimensional shape such as an optical lens array by means of exposure, and a fabrication method for the exposure mask.

As one of fabrication methods for micro optical parts such as microlens arrays for use in applied products of imaging devices such as CCDs (Charge Coupled Devices) and LCDs (Liquid Crystal Displays), there is a method which uses photolithography techniques employed in the fabrication of semiconductors and liquid crystal devices.

Namely, this method three-dimensionally processes a photoresist by giving the desired exposure amount distribution to the photoresist which is a photosensitive material, and three-dimensionally processes a silicon or glass substrate or the like by etching using the photoresist as a mask.

A first example of a photomask used in this lithography process is realized by multiple exposure using a plurality of masks as shown in FIG. 29. An exposure method using this technique will be described on a one-dimensional basis with reference to FIG. 29. A final exposure distribution is assumed to be D(X) in FIG. 29.

First, an exposure amount E[1] is given to a region <1> through a mask (1) in FIG. 29. Then, an exposure amount E[2] is given to a region <2> through a mask (2). At this time, a total exposure D1 of the region <1> becomes E[1]+E[2]. Further, a mask (3), a mask (4), . . . , mask (n), which are not shown, are respectively sequentially exposed with exposure amounts E[3], E[4], . . . , E[n], whereby a final exposure amount D[i] of a region i becomes D[i]=E[i]+E[i+1]+ . . . + E[n] and the desired discrete exposure amount distribution is obtained. In this case, the number of masks "n" corresponds to the position resolution of the exposure amount, and for example, if n=10, 10 gray scale exposure amount steps are obtained.

As a second example other than the multiple exposure using a plurality of masks, a method has recently been developed which obtains the desired exposure amount distribution through one exposure by using a so-called transmissive type of gray-tone mask which is a mask called High Energy Beam Sensitive (HEBS) glass having a mask substrate whose transmittance is given a continuous distribution as described in Japanese Patent Application Publication No. 2002-189280 and the specification of U.S. Pat. No. 4,567,104. A conceptual diagram is shown in FIG. 30.

As a third example, the specifications of U.S. Pat. No. 3,373,518, U.S. Pat. No. 5,310,623 and U.S. Pat. No. 6,335,151, which will be mentioned later, have proposed the use of a mask which is formed of binary patterns so that its pattern sizes are controlled to control light intensity on an exposure surface.

From among the above-mentioned methods, because the technique of the first example using multiple exposure with a plurality of masks is a plurality of multiple exposures and temporally needs multiple-step exposure, a staircase-like shape remains in any obtainable cumulative exposure amount distribution. In addition, the obtainable number of exposure gray scales is the number of mask, i.e., the number of times of exposure, and actually corresponds to approximately 10 steps which result in the problem that a sufficient number of gray scales are not obtainable. In addition, mask cost proportional to the complexity of the exposure process and the number of masks occurs, resulting in various problems.

The one-exposure method of the second example which uses the gray-tone mask is capable of providing an approximately continuous exposure amount distribution, but in general, this gray-tone mask is extremely difficult to fabricate and needs a special substrate material and special deposition process techniques. This results in extremely high mask cost. In addition, it has been pointed out that the special film material tends to suffer variations with time due to heat and has the problem of performance stability during use (thermal stability due to exposure light absorption).

The one-exposure method which uses the mask of the third example does not use a special semi-transparent light-blocking film and is made of so-called ordinary binary patterns, but the light intensity on the exposure surface is set to vary approximately continuously with respect to positions. In the specifications of U.S. Pat. No. 3,373,518 and U.S. Pat. No. 5,310,623, the mask is separated into sub-pixels which are divided vertically and horizontally with respect to the direction of the optical axis, and each sub-pixel is divided into color tone elements which are based on gray scale resolution, and light intensity is controlled by means of the ratio of transmissive ones to non-transmissive ones of these color tone elements.

Therefore, in the specifications of U.S. Pat. No. 3,373,518 and U.S. Pat. No. 5,310,623, since the above-mentioned color tone element is 0.2 µm on a side, the sub-pixel which is the unit of light intensity modulation is 2 µm long on a side. This leads to the problem that a sufficient number of intensity modulations cannot be obtained with respect to the unit lens size (~10 µm) of a microlens array of, for example, a liquid crystal projector, and it is impossible to deal with the formation of microlenses which are becoming smaller and smaller.

It is appropriate to apply a reduction projection exposure method in order to form far finer three-dimensional structures. In this case, however, instead of design which takes into account only the opening area in each sub-pixel, the sub-pixel size (sub-pixel pitch) must be set to not greater than a pitch defined optically, so that an image of the opening pattern in the sub-pixel is not formed. The specifications of U.S. Pat. No. 3,373,518 and U.S. Pat. No. No. 5,310,623 mainly assume proximity exposure as a premise, and do not make specific reference to any projection exposure method.

In the specification of U.S. Pat. No. 6,335,151, the numerical analysis of reduction projection exposure lithography is shown, and the opening centers of individual sub-pixels are concentrically arranged. For this reason, pitches in the X direction, the Y direction and oblique directions irregularly vary below a resolution limit and ripple-like light intensity occurs at locations where different pitches appear, so that the surface of a formed three-dimensional shape becomes rugged and greatly affects the performance of optical lenses. In addition, in this concentric arrangement, if pattern arrangement is performed so that a square lens array which optically uses its four corners as well can be formed, patterns are extremely difficult to arrange at the four corners.

Furthermore, in these specifications of U.S. Pat. No. 3,373,518, U.S. Pat. No. 5,310,623 and U.S. Pat. No. 6,335,151, as to pattern writing using EB (electron beam) in the fabrication of a mask for color tone element unit patterns in the sub-pixels, pattern design based on spot beam scanning (vector scanning or raster scanning) is performed, resulting in design digitized in the units of color tone elements. Accordingly, the openings in the sub-pixels become polygonal and in an actually fabricated mask, diffraction and scattering phenomena at mask pattern edges cannot be ignored. This leads to the problem that the mask transmittance cannot be represented by a simple pattern density and the desired mask transmittance cannot be achieved.

In addition, in the specification of U.S. Pat. No. 6,335,151, a resist is exposed and developed in advance by the use of a mask having no patterns, and pattern design based on the correlation between exposure amount and photoresist film thickness after development is performed. However, exposure with an actual gray-tone mask and exposure without patterns differ in flare light intensity occurring on the exposure surface. Accordingly, if the mask designed in the procedures of the specification of U.S. Pat. No. 6,335,151 is employed, exposure with the mask receives the influence of fog exposure due to unexpected flare. This results in the problem that the controllability of resist height is inferior at a location where mask transmittance is low.

SUMMARY OF THE INVENTION

The present invention has been made to solve the above-mentioned problems. Namely, according to the present invention, in an exposure mask for use in an exposure apparatus, a plurality of pattern blocks made of a pair of a light blocking pattern which blocks light emitted from the exposure apparatus and a transmissive pattern which transmits this light are continuously arranged (i.e., contiguously arranged), and the pitch of the continuous pattern blocks is constant in each of X and Y directions and the ratio of the light blocking pattern to the transmissive pattern does not takes on digitized (discrete) values but varies continuously gradually.

In addition, the light blocking pattern or the transmissive pattern is polygonal, and in order to reduce diffraction and scattering effects at pattern edges difficult to predict theoretically, the light blocking pattern and the transmissive pattern in each diffraction pattern block are simple squares or rectangles. Accordingly, a variable rectangular beam writing method which is currently the mainstream in semiconductor lithography can be applied to EB writing in a mask fabrication process. 2 nm is obtained on the mask as the minimum grid of a variable rectangular beam type of cutting-edge EB writer, and approximately continuous values are obtained as the converted size of the above-mentioned opening pattern on the wafer surface.

In addition, a fabrication method for an exposure mask in which a plurality of pattern blocks made of a pair of a light blocking pattern which blocks light emitted from an exposure apparatus and a transmissive pattern which transmits this light are continuously arranged so that a three-dimensional shape is formed by irradiating a predetermined amount of light onto a photosensitive material, includes a step of calculating an exposure amount distribution on the photosensitive material from design data on the three-dimensional shape, a step of calculating a transmittance distribution of the exposure mask based on the exposure amount distribution, inclusive of a main error cause such as flare intensity on an exposure surface, a step of calculating the pitch of continuous pattern blocks from optical conditions of the exposure apparatus, and a step of calculating the ratio of the light blocking pattern to the transmissive pattern within the pitch of the pattern blocks according to a transmittance distribution and arranging a plurality of pattern blocks having the respective ratios.

In the present invention having this construction, the pattern of the exposure mask is a simple binary pattern made of a light blocking pattern and a transmissive pattern. Accordingly, since it is not necessary to use a special light blocking film material, the fabrication cost of the exposure mask can be reduced and long-term performance stability can be ensured. A plurality of pattern blocks each made of these light blocking pattern and transmissive pattern are continuously arranged at a constant pitch, and the ratio of the light blocking pattern to the transmissive pattern is set be gradually varied, whereby the 0th order light intensity is modulated and a sufficient number of gray scales can be obtained even with one exposure.

Accordingly, the present invention has the following advantages. Namely, it is possible to easily fabricate masks from binary patterns each made of a transmissive pattern and a light blocking pattern, and it is also possible to obtain a sufficient number of gray scales by means of one mask. Accordingly, it is possible to greatly reduce costs to be spent for masks when a three-dimensional shape is to be obtained by exposure, and it is possible to easily obtain a three-dimensional shape of high accuracy.

BRIEF DESCRIPTION OF DRAWINGS

FIG. 11 is a view showing a mask for forming quadrangular pyramid shapes;

FIG. 12 is a view showing a mask for forming a concave cylindrical lens array;

FIG. 14A to 14C are explanatory views of a target shape of another embodiment;

FIG. 15 is an explanatory view of a remaining resist film characteristic;

FIG. 21 is a flowchart illustrating an actual example of pattern design;

FIGS. 27A to 27C are explanatory schematic views of a fabrication process for a microlens array;

DETAILED DESCRIPTION OF THE PRESENTLY PREFERRED EMBODIMENTS

Figure 1:
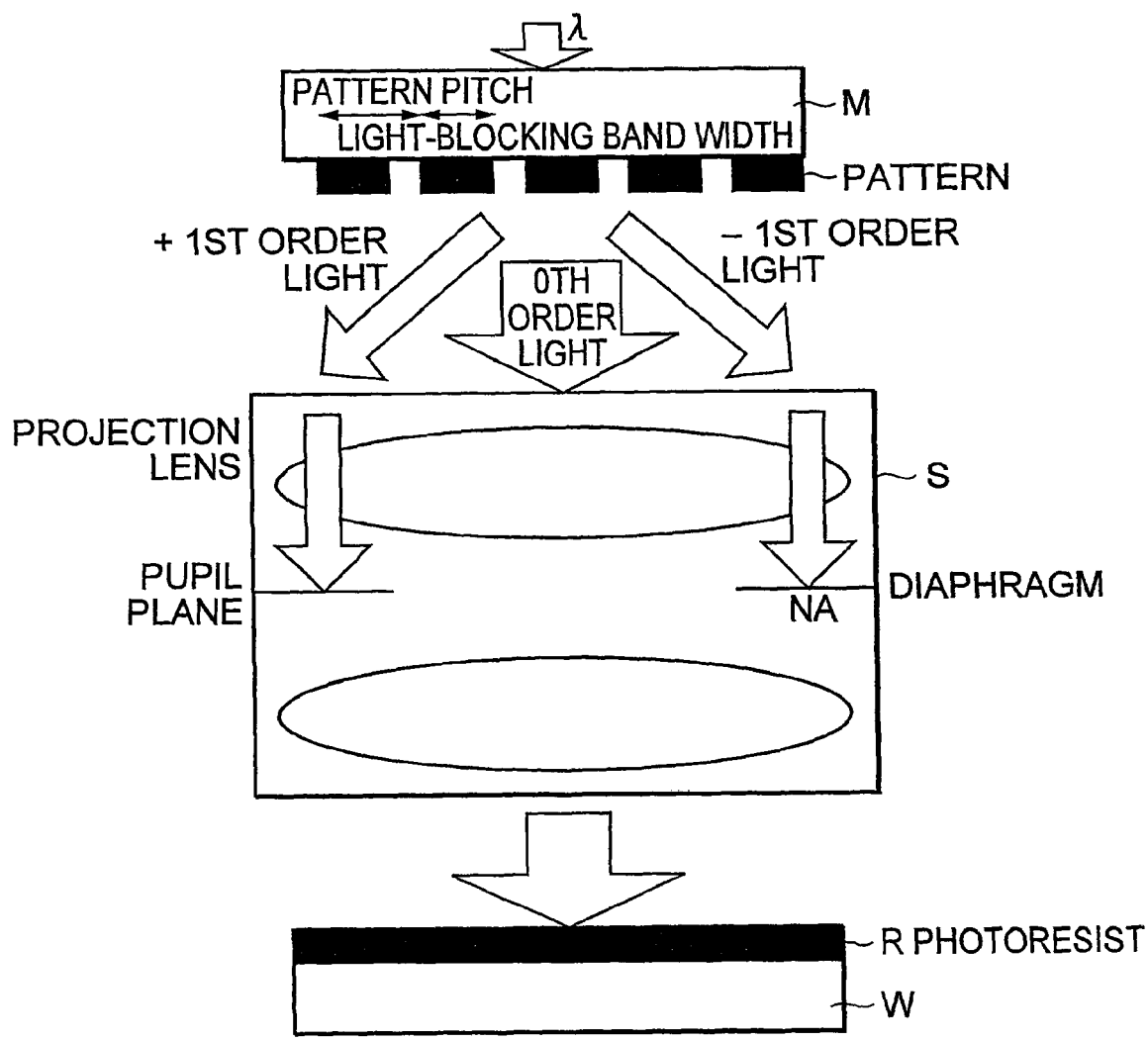
FIG. 1 is an explanatory schematic view of the principle of a mask according to the mode.

A mode of the present invention will be described below with reference to the accompanying drawings. First, the principle of an exposure mask (hereinafter referred to simply as "mask") according to the present mode will be described with reference to the schematic view of FIG. 1. Namely, an exposure apparatus S for use in transfer is constructed so that the pattern surface of a mask M and a surface of a wafer W are placed in a conjugate (image-forming) relationship, and normally forms an image of a pattern on the bottom surface of the mask M on the surface of the wafer W, thereby effecting transfer of the pattern.

However, when an exposure wavelength ($\lambda$), a constructed mask pattern pitch (P), a numerical aperture (NA) of the exposure apparatus, and a coherence factor ($\sigma$) indicative of the size of a secondary light source are given, a minimum pitch (Pmin) which allows an image to be formed on the surface of the wafer W is expressed by the following equation 1:

$$P\text{min} = \frac{\lambda}{NA \times (1 + \sigma)} \quad \text{(Equation 1)}$$

This Equation 1 is interpreted at the level of whether the lowest order ($\pm 1$) diffracted light should or should not be blocked by the NA diaphragm of a projection lens, and for example, if $\lambda=365$ nm, NA=0.5 and $\sigma=0.5$, Pmin=487 nm. Table 1 shows calculated examples of Pmin relative to individual values of NA and $\sigma$ for $\lambda=365$ nm.

TABLE 1

| | $\lambda = 365$ nm, Units [nm], On Wafer | | | | | |
|---|---|---|---|---|---|---|
| NA/$\sigma$ | 0.2 | 0.3 | 0.4 | 0.5 | 0.6 | 0.7 |
| 0.2 | 1520.8 | 1403.8 | 1303.6 | 1216.7 | 1140.6 | 1073.5 |
| 0.25 | 1216.7 | 1123.1 | 1042.9 | 973.3 | 912.5 | 858.8 |
| 0.3 | 1013.9 | 935.9 | 869.0 | 811.1 | 760.4 | 715.7 |
| 0.35 | 869.0 | 802.2 | 744.9 | 695.2 | 651.8 | 613.4 |
| 0.4 | 760.4 | 701.9 | 651.8 | 608.3 | 570.3 | 536.8 |
| 0.45 | 675.9 | 623.9 | 579.4 | 540.7 | 506.9 | 477.1 |
| 0.5 | 608.3 | 561.5 | 521.4 | 486.7 | 456.3 | 429.4 |

Namely, fine pitch patterns not greater than Pmin do not allow diffracted light to reach the surface of the wafer W, so that interference of diffracted light, i.e., image formation of mask patterns, does not at all occur. However, the 0th order light reaches the wafer W. For the same pitch, the intensity of the 0th order light becomes smaller with respect to an increase in light blocking band width, whereas if light blocking parts have the same size, the intensity of the 0th order light becomes larger with respect to an increase in pitch within the range of pitches not greater than Pmin.

Specifically, letting R ($<1$) be the area ratio of transmissive portions in a unit repeated pattern, light intensity which reaches the wafer surface is $R^2$. For example, the 0th order light in a 1:1 line-and-space pattern is 0.25. Similarly, the 0th order light in a 1:1 two-dimensional square hole array is 0.0625.

Figure 2A:
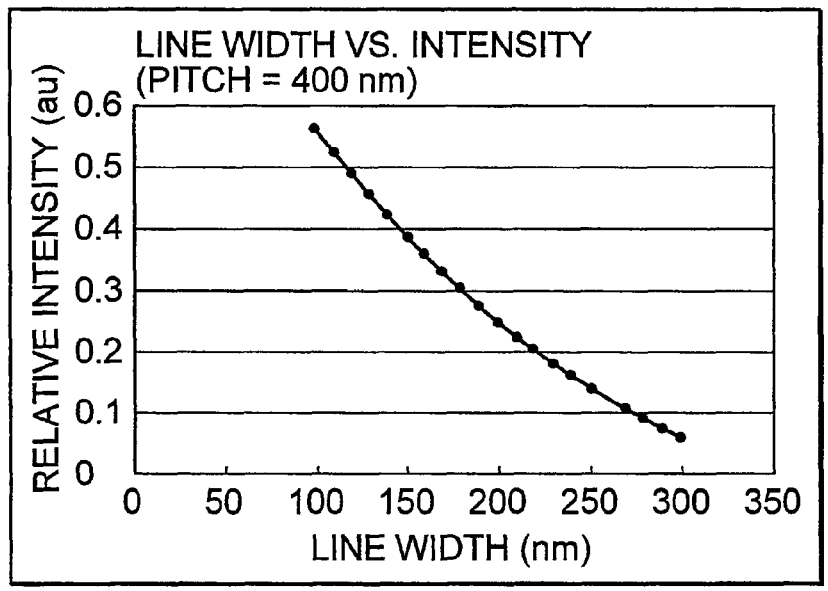
FIGS. 2A and 2B are explanatory views of calculated examples of 0th order light intensity with respect to the size ratios of patterns.
Figure 2B:
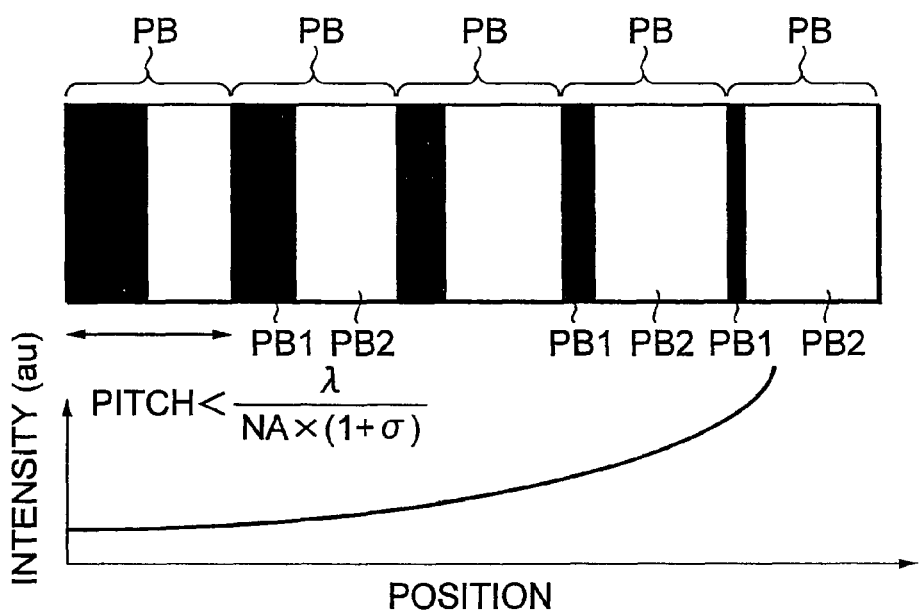

The mask M according to the present mode is characterized in that a mask pattern is designed by the use of this principle. Namely, a plurality of pattern blocks are constructed at a pitch not greater than the value calculated from Equation 1, and the size ratio of a light blocking pattern (light blocking band) to a transmissive pattern in each of the pattern blocks is varied within the range of the pitch, whereby it is possible to obtain the desired 0th order light. FIGS. 2A and 2B show calculated examples for the case of a one-dimensional pattern. The pitch (P) of each pattern block PB is 400 nm and Equation 1 is satisfied from the optical conditions of the exposure apparatus shown in FIG. 2A, whereby image formation does not occur. From the above description, a transmittance absolute value (Tabs) relative to a one-dimensional pattern of pitch P and light blocking band width=line width (W) is expressed by the following equation:

$$T_{abs}(W) = \left(\frac{P - W}{P}\right)^2 \quad \text{(Equation 2)}$$

Accordingly, it is possible to obtain an arbitrary light intensity by varying the width of a light blocking pattern PB1 of one pattern block PB (a pair of the light blocking pattern PB1 and a transmissive pattern PB2) at a pitch (400 nm in the example of FIG. 2A) not greater than the pattern pitch expressed by Equation 1. Therefore, as shown in FIG. 2B, it is possible to control the desired intensity distribution by arranging patterns (pitches (Pitch), the widths of the light blocking patterns PB1) which respectively provide predetermined light intensities at predetermined positions. As mentioned above, the values of the pattern sizes PB1 are not discrete values but a continuous variable.

Figure 3:
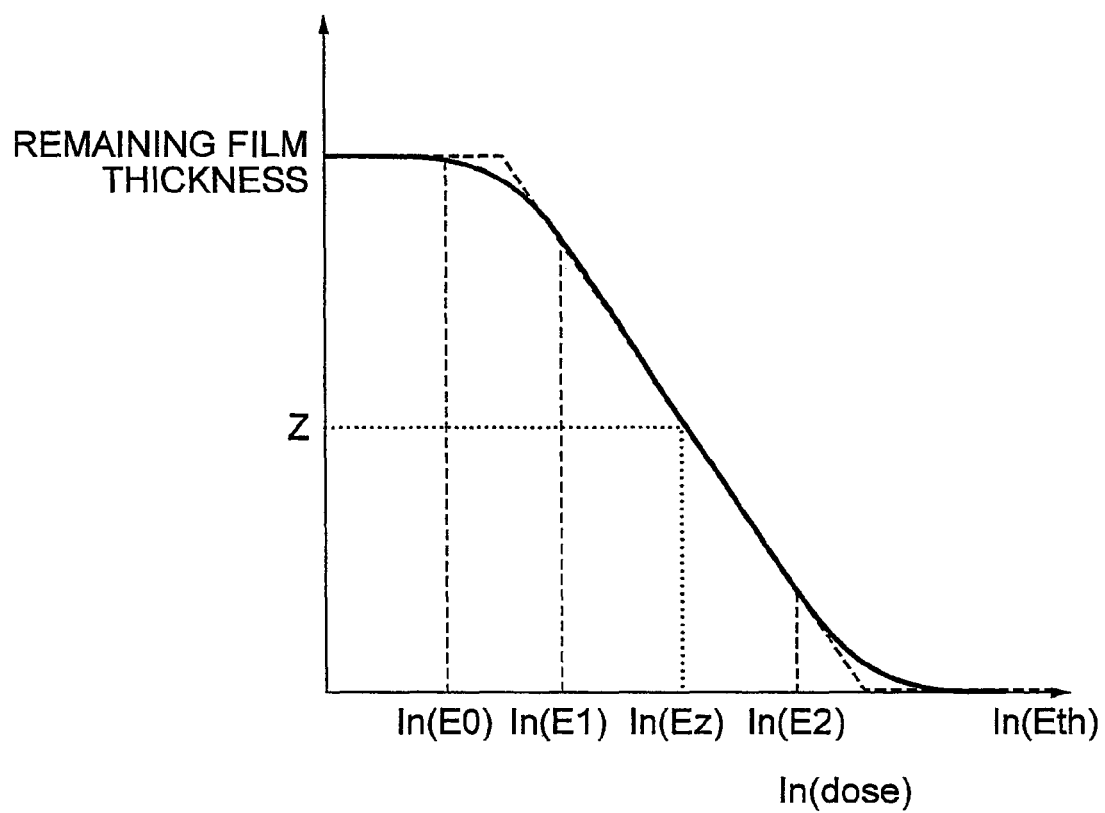
FIG. 3 is a view showing a contrast curve of a photoresist.

Incidentally, the final objective is to transfer a three-dimensional shape such as a lens to a substrate of glass or the like, and its final shape accuracy greatly depends on a photoresist shape which is an intermediate product. The three-dimensional shape is transferred to the substrate by drying etching using as a mask the three-dimensional shape of a photoresist obtained after exposure and development. Accordingly, it is important to highly accurately form this photoresist shape. The relationship between the remaining film characteristic of the photoresist and exposure amounts will be described in brief. FIG. 3 is a graph showing a contrast curve which is generally plotted in order to measure the sensitivity and contrast of a photoresist.

The horizontal axis represents the logarithms of exposure amounts given to the photoresist, while the vertical axis represents film thicknesses after developments which are measured by a film thickness gauge. In FIG. 3, an exposure amount with which a film thickness loss begins is defined as E0, and an exposure amount with which the film thickness reaches zero is defined as Eth.

In general, however, near E0 and Eth, the linearity of the remaining film amount with respect to the exposure amounts (the logarithmic scale) is inferior, so that the remaining film amount is difficult to control with the exposure amounts with high accuracy. For this reason, in the present mode, as shown in FIG. 3, a linear region of from E1 to E2 (E0<E1 to E2<Eth) is selected, and only the exposure amounts in this linear region are used.

Namely, the film thickness of a photoresist to be used becomes correspondingly sufficient with respect to the desired processing depth amount. For example, the film thickness of the photoresist may be set so that its initial resist film thickness=desired processing depth×1.1.

From FIG. 3, for example, the exposure amount necessary for obtaining a remaining film thickness Z is found as Ez. Accordingly, from a shape distribution at a height at the desired position, the exposure amount distribution necessary for obtaining this shape is found.

Here, E2=Emax, and the transmittance of a mask is calculated on the basis of this exposure amount. Incidentally, in the following description, it is assumed that a shape to be formed is a one-dimensional lens array Z=f(X). Namely, letting f(X) be a target shape of a photoresist=a remaining film distribution, an exposure amount distribution D(X) for obtaining this remaining film distribution f(X) is obtained from the contrast curve of the photoresist to be used. This D(X) is standardized so that the maximum value of D(X) becomes E2, whereby D(X) is converted to a target relative transmittance distribution T(X) of the mask.

A mask pattern from which this standardized T(X) can be obtained is constructed by using a pattern pitch and the light blocking pattern width of each mask block which satisfy Equation 1.

A specific fabrication method for the mask will be described below with reference to the flowchart of FIG. 4.

Step 1: The desired three-dimensional shape Z=f(X) to be formed by mask exposure is defined. In this step, the three-dimensional shape Z=f(X) is defined on the basis of design data prepared in advance, and the size of one element (for example, one lens of a lens array) is set to 2 L (−L and L).

Step 2: A resist shape Z=f'(X) which can become the desired shape after etching is defined from etching data which has been separately acquired in advance (the difference between a resist shape and a shape after etching=a conversion difference). The etching conversion difference is not a constant amount but an amount which varies depending on the height of a resist. Accordingly, the data is acquired in advance and a table of function approximation or conversion difference is created to define f'(X). Namely, letting $f_{et}(\ )$ be a function expressing the conversion difference, the shape after etching is $Z=f_{et}(f'(X))$, and the resist shape must be made a shape expressed by the following equation so that this $Z=f_{et}(f'(X))$ becomes the desired shape Z=f(X). In the following equation, $f_{et}^{-1}(\ )$ represents the inverse function of $f_{et}(\ )$.

$$f'(x)=f_{et}^{-1}(f(x))$$ (Equation 3)

Step 3: A resist remaining film characteristic like that shown in FIG. 3 is acquired, and the exposure amount distribution D(X) necessary for obtaining the shape Z=f'(X) at the stage of resist is obtained.

Step 4: D(X) is standardized with the maximum exposure amount E2 and is converted to the target relative transmittance distribution T(X).

Step 5: The pitch P which is expressed by Equation 1 and permits a sufficient number of gray scales to be obtained with respect to the element size 2 L is selected from pitches not greater than the pattern pitch. Letting N be the number of gray scales on one side, the pitch P is selected so that P=L/N. Accordingly, since one element is formed by an integral number of pattern blocks, inconsistency does not occur in the transmittance of any of element boundaries, and the light amount can be continuously modulated.

Step 6: Light blocking pattern widths (line widths) are respectively varied between Wmin and P-Smin at the pitch P derived previously, whereby the 0th order light intensity is calculated for each of the line widths as shown in FIGS. 2A and 2B. For the convenience of calculation, the light blocking patterns are defined to be infinitely repeated at the pitch P. Furthermore, after this, the whole is standardized with the 0th order light intensity ($I_0$) for a reference line width. In this case, the light intensity ($I_0$) for a minimum line width of 100 nm is set to $I_0$=0.5625, and the light intensity for each of the line widths is divided by 0.5625 (Equation 2 is divided by $I_0$).

Incidentally, Wmin represents the lower fabrication limit of the sizes of lines (not removed) which are the light blocking patterns of the mask, while Smin represents the lower fabrication limit of the sizes of spaces (removed) which are the transmissive patterns of the mask. Incidentally, L, P, Wmin and Smin are size notations relative to the wafer surface which are converted in terms of the projection magnification of an exposure apparatus to be used, and Wmin and Smin are set in advance so as not to become lower than the lower limit of mask fabrication size during the design of the mask pattern.

Step 7: Line widths W(X) at X coordinates in a target three-dimensional shape are obtained from the following equation in which the normalized 0th order light intensity obtained in Step 6 and the target relative transmittance distribution T(X) obtained in Step 4 are made equal to each other. In the following equation, X=iP (discrete values), i=0, ± 1, . . . , ±N.

$$W(X=P(1-\sqrt{I_0 \times T(x)})$$ (Equation 4)

The mask designed and fabricated from these steps is subjected to exposure and transfer, and after development, the desired remaining film distribution Z=f'(X) can be obtained, and after etching, the final desired three-dimensional shape Z=f(X) can be obtained.

Figure 5:
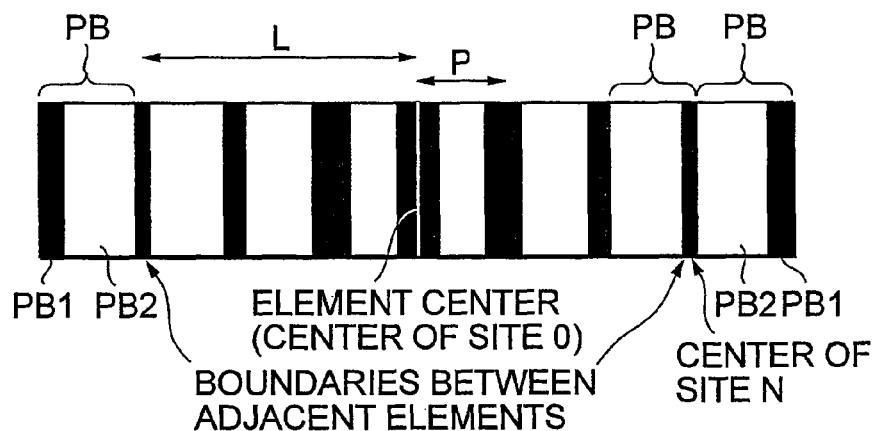
FIG. 5 is a view showing an example of a mask constructed by one-dimensional line-and-space patterning.

FIG. 5 is a view showing an example of a mask constructed by one-dimensional line-and-space patterning. In this example, the pitch P of the continuous pattern blocks PB is set to 1/an integer of the element size 2 L, and the variation of the ratio of the line (the light blocking pattern PB1) to the space (the transmissive pattern PB2) is inverted at an interval of L. Accordingly, a three-dimensional shape made of continuous convex and concave shapes can be formed by mask exposure.

Although the above description has referred to one-dimensional arrangement of the pattern blocks PB, this arrangement may also be expanded into a two-dimensional one. In this case, the above-mentioned Z=f(X) may be defined with Z=f (X,Y). The two-dimensional mask construction pattern is formed by a contact hole pattern or an island pattern which is used for general photomasks for fabrication of semiconductor devices, liquid crystal devices and the like.

Figure 6:
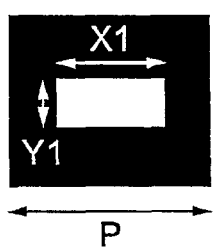
FIG. 6 is an explanatory view of the correlation between pattern and transmittance.

In Step 6 (refer to FIG. 4) of the one-dimensional mask fabrication method, when the light blocking pattern widths (or the transmissive pattern widths) are to be varied, it is possible to use either a construction using square patterns made of squares of X=Y each having a varied length on a side or a construction using rectangular patterns respectively having light blocking pattern widths (or transmissive pattern widths) which are varied in size in matrix form in the XY directions. Namely, in the latter case, the correlation between pattern and transmittance, such as that shown in FIG. 6, is derived. The derived correlation and the desired three-dimensional transmittance distribution T(X,Y) are used to derive the desired mask pattern arrangement.

Embodiments

An embodiment of the present invention in which a target shape is a one-dimensional spherical array (cylindrical lens array) will be described below with reference to the flowchart shown in FIG. 4 mentioned previously.

Figure 7:
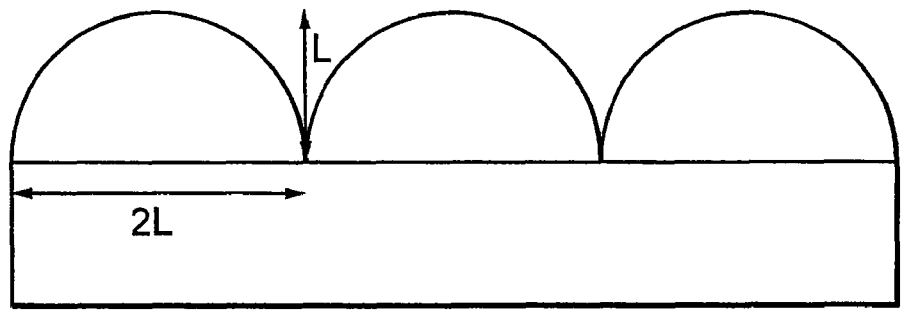
FIG. 7 is a view showing a target three-dimensional shape.

A one-dimensional spherical array (cylindrical lens array) is set as a target shape. It is assumed that the size of a unit element which constitutes this one-dimensional spherical array is 2 L (L=10 um) on each side and the processing depth is L. Namely, $f(X)=\sqrt{(L^2-X^2)}$ (this processing corresponds to Step 1 of FIG. 4). This target shape is shown in FIG. 7.

An etching rate for a resist/substrate to be used is separately found. For the sake of simplicity of description, the etching rate is assumed to be 1:1. Namely, it is assumed that the resist shape, after etching, is processed without modification (this processing corresponds to Step 2 of FIG. 4).

First, the resist to be used is coated to a depth not less than a predetermined processing depth, and data on film thicknesses relative to exposure amounts (dose) are obtained. From the data, on the basis of data on film thicknesses relative to ln(dose), a range of E1-E2 having the desired linearity is determined. As a linear approximation within this range, $Z=A+B\times\ln(E)\{E1<E<E2\}$ is obtained (this processing corresponds to Step 3 of FIG. 4).

Since the etching conversion difference of this material can be ignored, the target height f(X) at an X coordinate may be assumed to be f(X)=a resist height after development. Therefore, an exposure amount for obtaining the height f(X) at the X coordinate is expressed by the following equation 5:

$$D(x) = \exp\left(\frac{f(x)-A}{B}\right) \quad \text{(Equation 5)}$$

Further, this Equation 5 is normalised with the maximum value E2 of the exposure amount, and a target relative transmittance distribution at the X coordinate is obtained as expressed by the following equation 6 (this processing corresponds to Step 4 of FIG. 4):

$$T(x) = \frac{1}{E2} \times D(x) \quad \text{(Equation 6)}$$

As to an exposure apparatus to be used, λ, NA, σ and magnification are defined. In this embodiment, it is assumed that an exposure apparatus of λ=365 nm, NA=0.5, σ=0.5, and reduction magnification=⅕ is used. In addition, it is assumed that the background of a mask is 100% transmissive, and the transmittance of each line pattern is 0% (light is completely blocked). In this case, the resolution limit pitch expressed by Equation 1 is calculated as P=487 nm (on the wafer). The number of gray scales is preferably made as large as possible, but in this embodiment, 25 gray scales are used on one side for ease of mask fabrication. Namely, a converted pitch on the wafer surface is 10 um/25=400 nm. Therefore, this pitch pattern is not resolved. The element center is defined as site 0, and defines as ±1, ±2, . . . , ±25 (this processing corresponds to Step 5 of FIG. 4).

Then, the 0th order light intensities obtainable when the light block pattern width is varied at a pitch of 400 nm are calculated (refer to FIGS. 2A and 2B). In this processing, light blocking band widths which enable target relative transmittances to be obtained at the respective sites are found from the transmittance distribution (Equation 6) found in Step 4 shown in FIG. 4. Namely, as to site m, its central X coordinate is mP, and the target relative transmittance at this coordinate is found as T(mP)=1/E2×D(mP) from Equation 6. The light blocking band width W at X=mP is found so that this T(mP) coincides with a value obtained by dividing a light intensity for the pitch P and the light blocking band width W, which are found from Equation 2, by the light intensity of a reference pattern (in this case, the boundary between each lens element). Thus, the light blocking pattern width in each of the sites is obtained from Equation 4 (this processing corresponds to Steps S6 and S7 of FIG. 4).

A specific example will be described below in brief as to the case where a target shape is a two-dimensional array. The target shape is assumed to be a spherical lens array having a radius L and element XY sizes 2 L×2 L. One-dimensional processing of Steps S1 to S5 mentioned above is a common process.

In the case of a two-dimensional construction, its constituent patterns are not line-and-space patterns but a contact hole array or an island array. In the two-dimensional construction as well, its resolution limit pitch is the same as that in the one-dimensional construction, and its construction pitch is a pitch not greater than Pmin expressed by Equation 1.

Figure 8:
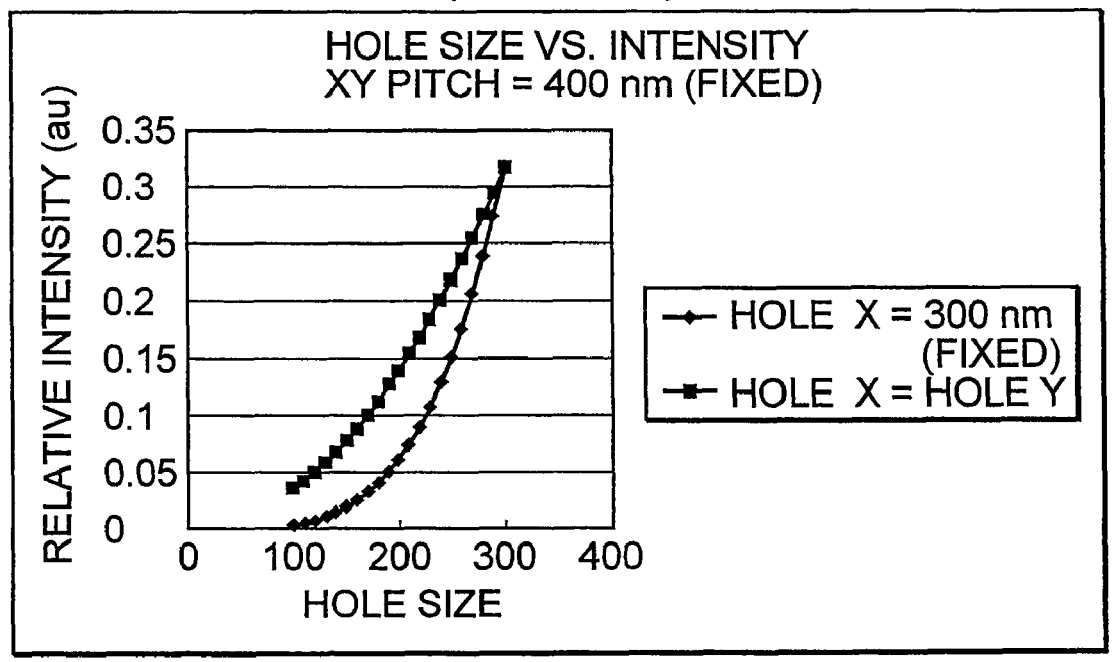
FIG. 8 is a view showing relative intensities obtained when hole sizes are changed.

In this embodiment, an objective is to obtain an arbitrary three-dimensional intensity distribution over a light blocking blank of 0% background transmittance by means of a contact hole array of 100% transmittance. As to the constituent patterns, as shown in FIG. 6, the XY sizes of their holes are varied in matrix form to obtain various kinds of transmittance data. The hole patterns of this construction are assumed to be defined as two-dimensional infinite repetition of holes of the same hole size, and the transmittance data are calculated on this assumption. FIG. 8 shows examples of calculated relative intensities of contact holes some of which have different hole sizes varied with X=Y at fixed XY pitches (400 nm), while the other of which have different hole Y sizes with their hole sizes X=Smax (=300 nm) fixed. It is seen that even the patterns of fixed X can obtain about ten times the modulation range of light intensity.

Figure 4:
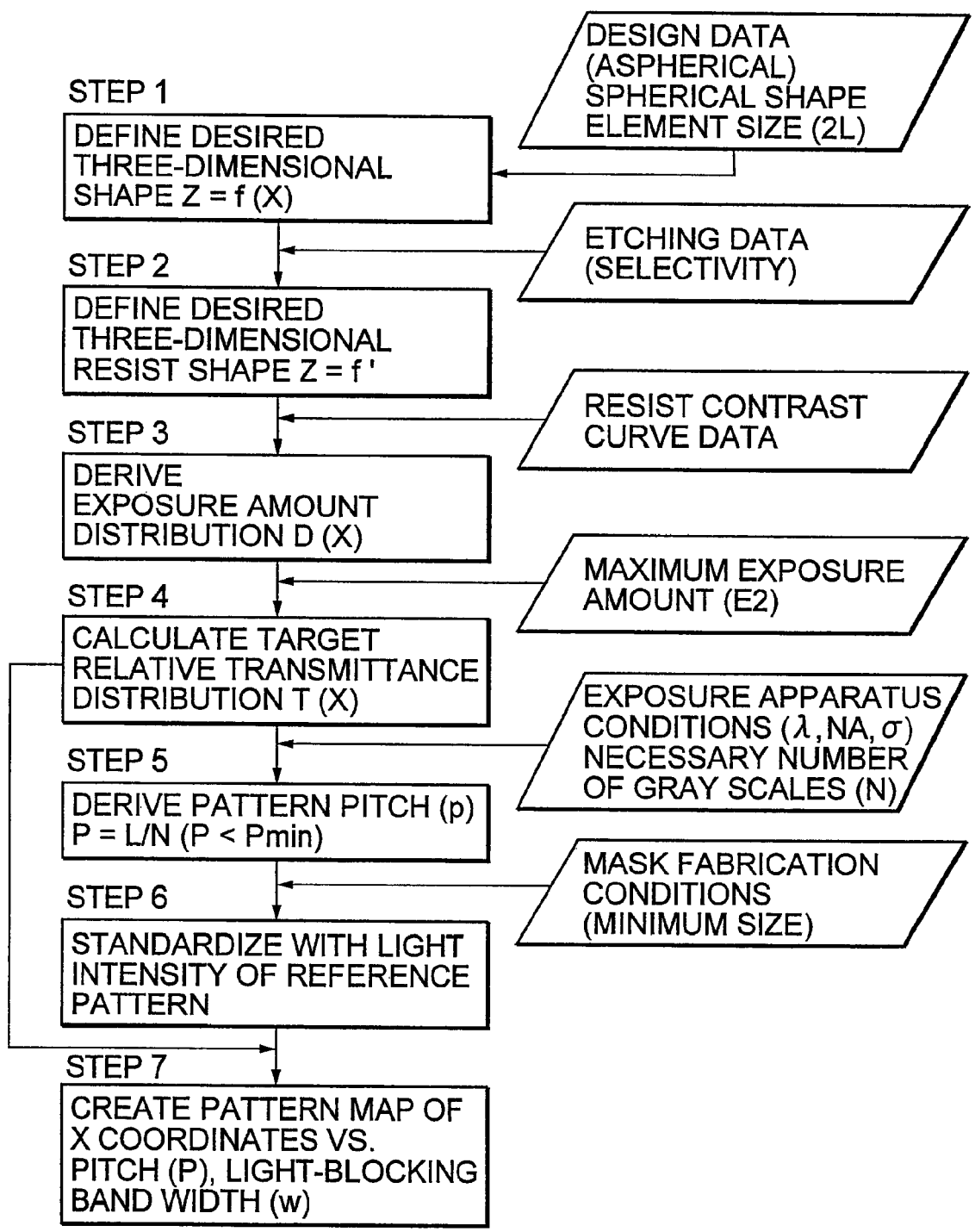
FIG. 4 is a flowchart describing a fabrication method for a mask.

Target transmittances at sites m and n are T(mP, nP) similarly to the above discussion regarding one dimension, and patterns (XY hole sizes) which obtain these target transmittances are arranged in the respective sites through steps to which Steps 6 and 7 of FIG. 4 are two-dimensionally expanded.

In this embodiment, reference has been made to a one-dimensional cylindrical lens array and a two-dimensional spherical array, but a target three-dimensional shape f(X,Y)

may be arbitrary and it is possible to design masks for forming, from photoresists, arbitrary three-dimensional shapes such as aspherical arrays or quadrangular pyramid shapes (pyramids).

Figure 9:
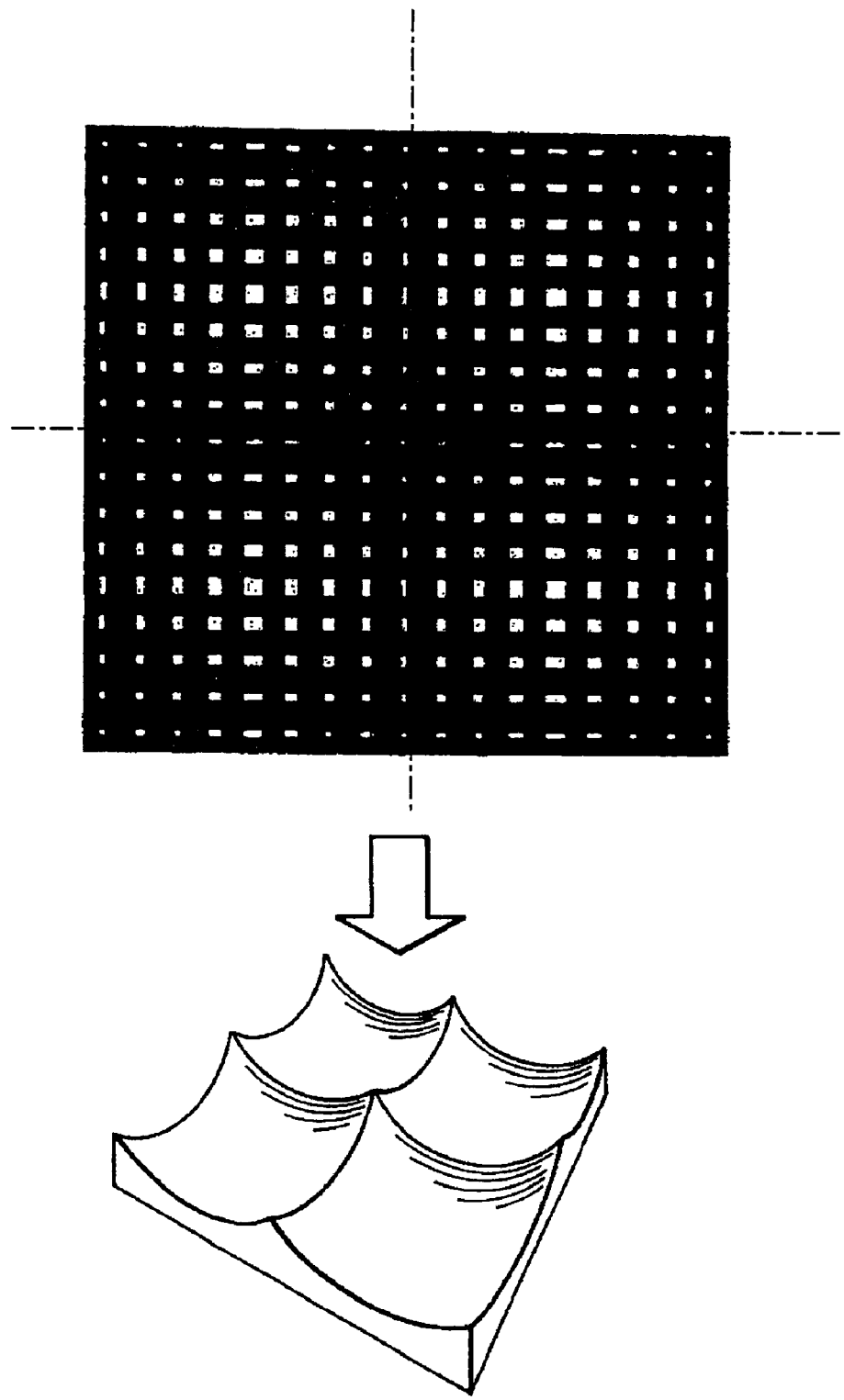
FIG. 9 is a view showing a mask for forming a concave spherical lens array.
Figure 10:
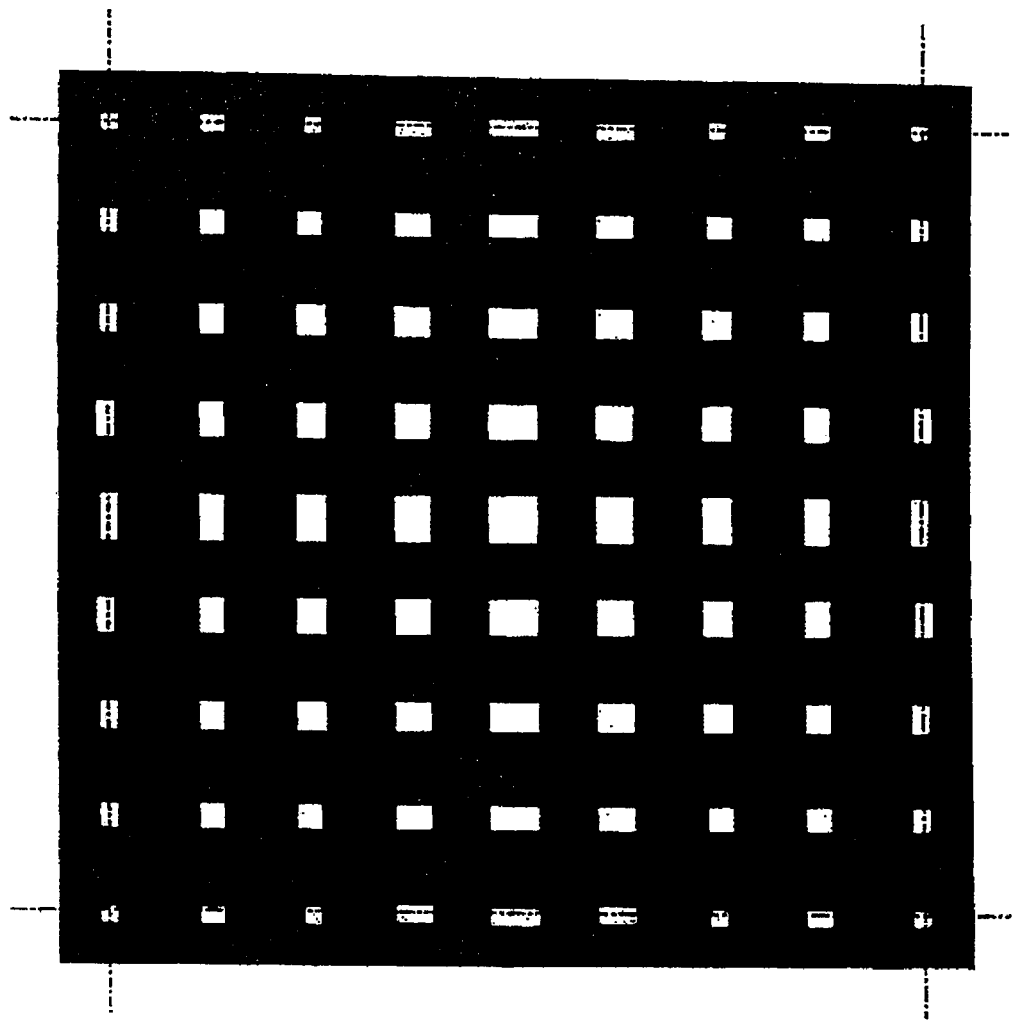
FIG. 10 is a view showing a portion corresponding to one lens element.

The results of calculations performed on specific mask examples by means of a resist simulator will be described below. FIG. 9 is a view showing a mask for forming a concave spherical lens array by the use of a positive resist, and FIG. 10 is a view showing a portion corresponding to one lens element of the mask shown in FIG. 9. In FIGS. 9 and 10, dot-dashed lines represent the boundaries between elements which correspond to individual lenses. In the concave spherical lens array, one pattern block is constructed as a through-hole type which is made of a light blocking pattern and a transmissive pattern. Pattern blocks are two-dimensionally arranged so that the ratio of the light blocking pattern to the transmissive pattern is gradually varied.

At the boundary between each of the elements, pattern blocks arranged along the boundary are disposed so that their transmissive patterns (or their light blocking patterns) overlap one another between adjacent ones of the elements. Accordingly, it is possible to eliminate unnecessary seams from the boundaries between lenses formed by the respective elements. It is to be noted that if the transmittance distribution of this mask is inverted, i.e., the hole size of the center of the lens is made smallest and the other hole sizes are made larger toward the periphery of the lens, a convex spherical lens array can be formed. Otherwise, if the background is made 100% transmissive and an island array pattern is adopted, a mask which can form a convex spherical lens array is obtained.

FIG. 11 is a view showing a mask for forming quadrangular pyramid shapes by the use of a positive resist. In FIG. 11, there is shown only a mask portion corresponding to one of the shown four quadrangular pyramid shapes. In this mask, one pattern block is constructed as a square hole array type which is made of a light blocking pattern and a transmissive pattern, and pattern blocks are two-dimensionally arranged so that the ratio of the light blocking pattern to the transmissive pattern is varied according to the desired exposure amount distribution.

FIG. 12 is a view showing a mask for forming a concave cylindrical lens array by the use of a positive resist. In FIG. 12, there is shown only a mask portion corresponding to one of the shown two cylindrical lenses. In this mask, one pattern block is made of a straight-line-shaped light blocking pattern and a transmissive pattern, and pattern blocks are one-dimensionally arranged so that the ratio of the light blocking pattern to the transmissive pattern is gradually varied.

It is to be noted that if the light blocking pattern and the transmissive pattern of each of the pattern blocks of this mask are inverted, a mask which can form convex cylindrical lens array is obtained.

Another embodiment of the present invention will be described below. FIGS. 13A to 13E are explanatory schematic views of another embodiment. This embodiment is characterized in that in order to form one three-dimensional structure on a wafer coated with a photoresist, the exposure amount necessary for forming the shape of the three-dimensional structure is obtained by addition of two exposures.

Namely, when exposure for forming the desired shape is to be performed, masks Mx and My each formed of lines extending in a direction orthogonal to those of the other are used (refer to FIGS. 13A and 13B), and two exposures using these masks Mx and My are superimposed to perform addition of the exposure amounts, thereby forming the objective shape.

For example, when a two-dimensional lens array as shown in FIG. 14B is to be formed, the mask Mx having line and space patterns arranged in one direction (refer to FIG. 13A) and the mask My having line and space patterns arranged in a direction perpendicular to this one direction (refer to FIG. 13B) are employed, and exposures using the masks Mx and My are performed at the same position on the same wafer in a superimposed manner, whereby a resist shape for a two-dimensional lens array as shown in FIGS. 14A and 14C is obtained through development. FIG. 14A shows a unit lens shape, while FIG. 14B shows an array lens shape.

Incidentally, this embodiment is based on the assumption that the background of each of the masks is 0% transmissive and space patterns are respectively arranged in sites. In addition, it is assumed that the unit lens shape of a two-dimensional lens array to be formed uses an aspherical function f(r) which is defined by the following equation 7. The following description is given on the assumption that $r^2=x^2+Y^2$ and the following specific numerical examples are used: c (curvature)=0.004 and K (conic constant)=−0.75.

$$f(r) = \frac{cr^2}{1 + \sqrt{1 - (1+k)c^2 r^2}} \quad \text{(Equation 7)}$$

Figure 13A:
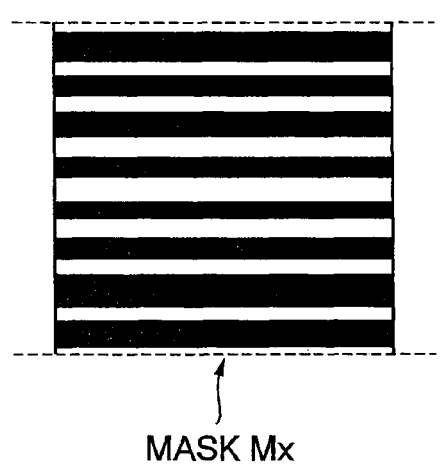
FIGS. 13A to 13E are explanatory views of another embodiment.
Figure 13B:
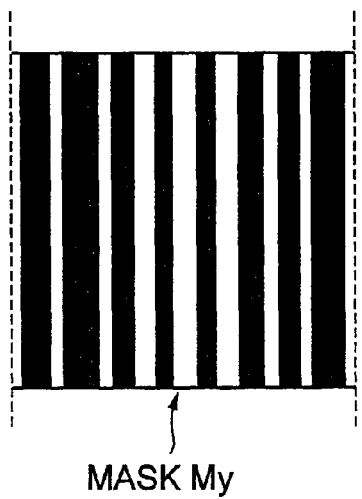

A specific design technique for the masks Mx and My of this embodiment shown in FIGS. 13A and 13B will be described below. A basic mask design technique is similar to that of the prior application, and it is assumed that the remaining film characteristic of the photoresist as shown in FIG. 15 (Z=A+B*ln(E): in this embodiment, A=24.8, B=−4.674, and its initial film thickness is 5 μm) and the target aspherical lens shape of the unit lens element as shown in FIG. 14A are predefined. In the embodiment to be described below, it is assumed that the etching selectivity is 1:1 and the shape of the photoresist after development is equal to a substrate shape after etching.

Figure 16:
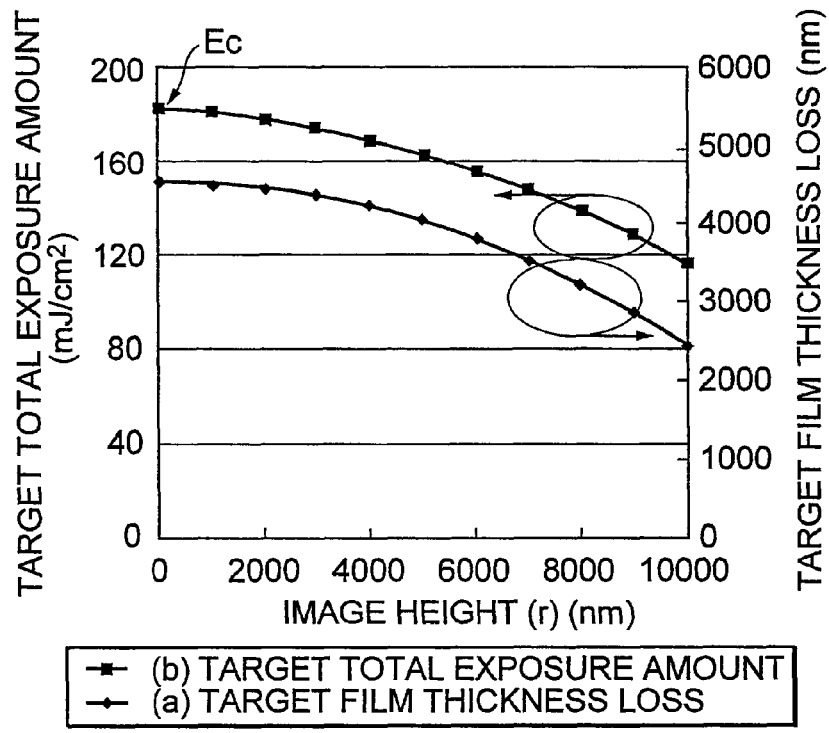
FIG. 16 is an explanatory view of a resist film thickness loss distribution after development with respect to image height.

A resist film thickness loss distribution after development with respect to image height is shown in FIG. 16(a). In general, photoresists are inferior in the linearity of their remaining film thicknesses relative to exposure amounts in the vicinity of exposure amounts for which their film thicknesses become completely zero. Accordingly, these regions should not be used for structure formation. For this reason, the lens center is designed so that its remaining film becomes not zero (the amount of film thickness loss is not 5 μm) but 0.5 μm thick.

First, on the basis of the resist remaining film characteristic of FIG. 15 and the target design shape of FIG. 14A (aspherical equation), a cross-sectional shape for Y=0 is found from $Z=f_{y=0}(X)$, and an exposure amount distribution E(X) for obtaining this shape after development is obtained from the following equation. This E(X) is shown in FIG. 16(b).

$E(X)=\exp[(f(X)-A)/B]$

Furthermore, letting $E_c$ be an exposure amount to be given at the lens center in E(X), an exposure amount distribution $E_{Mx}(X)$ to be given by the mask Mx is as follows:

$E_{Mx}(X)=\exp[(f(X)-A)/B]-E_c/2$

Then, the maximum value of $E_{Mx}(X)$ is set to $E_0$, and a relative transmittance distribution $T_L(X)$ is obtained by dividing E(X) by this $E_0$.

From a line pattern fabrication lower limit value ($L_{min}$) of the mask and a mask pattern pitch (P) which satisfies Equa tion (1), a maximum transmittance ($T_{max}$) of the mask becomes:

$$T_{max}[(P-L_{min})/P]^2$$

In this embodiment, $L_{min}=160$ nm (in this embodiment, 400 nm on the mask on the assumption that a 1.25× reduction projection exposure apparatus is used), and $T_{max}$ is 0.706. From these values, a mask transmittance absolute value ($T_{abs}(X)$) becomes:

$$T_{abs}(X)=T_{max} \times T_L(X)$$

Figure 17:
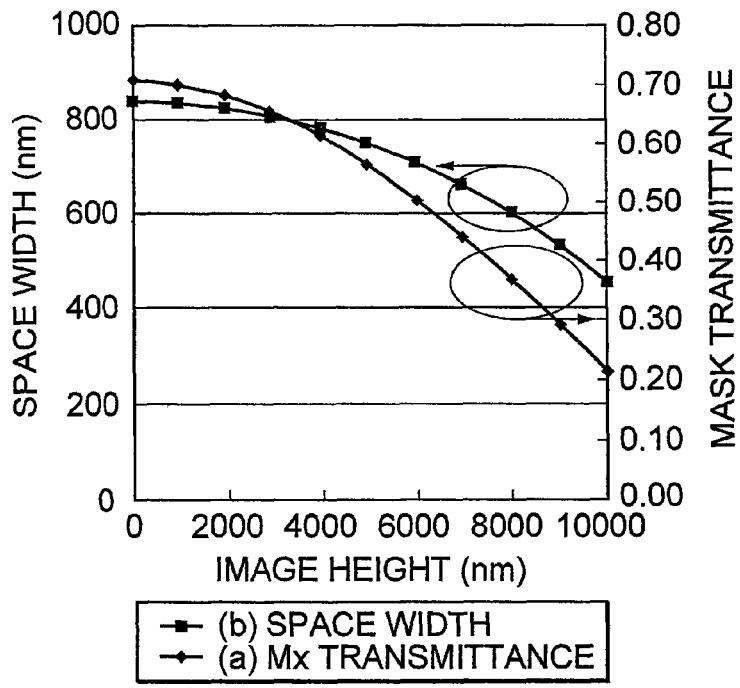
FIG. 17 is an explanatory view of the transmittance and space size of a mask Mx.

This $T_{abs}(X)$ is shown in FIG. 17(a).

The space size of a mask pattern for obtaining this transmittance is obtained from the following equation:

$$S(X)=P \times [T_{abs}(X)]^{1/2}$$

This $S(X)$ is shown in FIG. 17(b). In this equation, X is the central coordinate values of a space pattern, and takes on discrete values of $X=mP$ (m is zero or a positive/negative integer).

Although the designing method for the mask Mx has been described above, the mask My is obtained by rotating the pattern of the mask Mx by 90°.

The masks Mx and My for forming the two-dimensional lens array can be designed through the above-mentioned procedures. An exposure amount ($E_{set}$) for exposing each of the masks Mx and My becomes:

$$E_{set}=E_0/T_{max}$$

Incidentally, in the two-dimensional lens array formed by this multiple exposure method using two masks, the four corners of each unit lens are degraded in shape accuracy because of its mask pattern design. The range in which formed shapes can be actually obtained with good accuracy is $X^2+Y^2<10^2$ as shown in FIG. 14A (20 μm is the length of one side of each unit lens), and when a lens array formed by the present method is to be actually incorporated into a predetermined optical system, the lens array is desirably used in combination with a circular opening array for blocking light at four corners as shown in FIG. 14C, as the occasion demands.

Figure 13C:
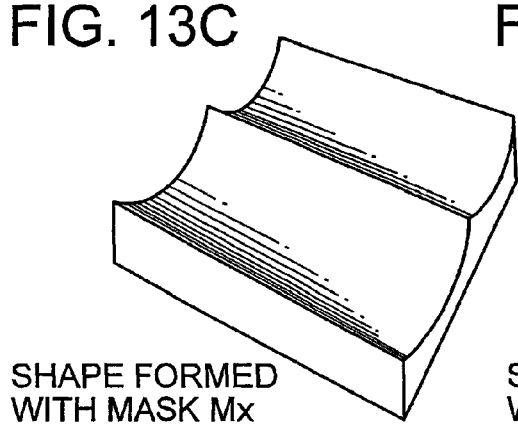
Figure 13D:
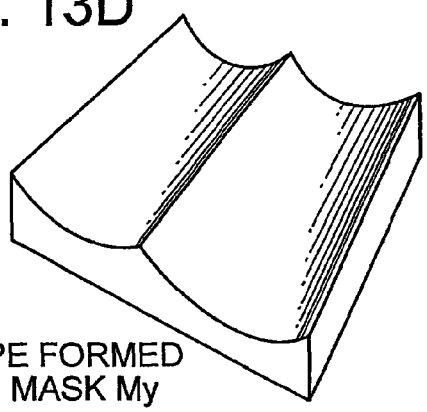
Figure 13E:
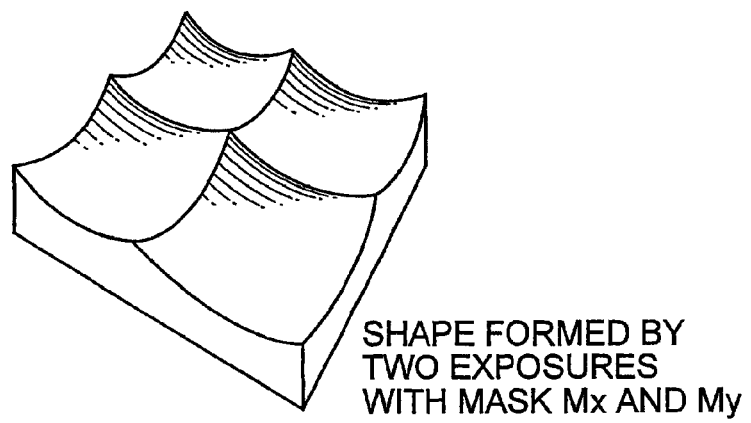

FIG. 13E shows the simulation result of a resist shape obtainable when the mask Mx having the transmittance and the space width shown in FIG. 17(b) and the mask My orthogonal to this mask Mx are subjected to two exposures followed by development. FIGS. 13C and 13D show the simulation results of formed shapes obtainable when the respective masks Mx and My are exposed, and in practice, after two exposures with the masks Mx and My have been performed, the lens shape shown in FIG. 13E can be obtained. It can be seen that a resist shape of good accuracy can be similarly obtained by the use of two exposures.

According to the present embodiment, it is possible to form a two-dimensional lens array shape by exposing a mask having a simple line-and-space pattern. Structures such as concave-convex lenses, aspherical lenses and prisms can also be formed by designing their patterns through the above-mentioned procedures. In addition, the present embodiment can also be applied to design and fabrication of any two-dimensional shape forming masks other than the above-mentioned masks for fabricating microlens arrays.

Furthermore, in the present embodiment, the masks Mx and My are shown as separate masks, but the mask patterns Mx and My may be arranged on the same substrate so that the exposure of the present embodiment can be applied only by modifying an exposure area without exchange of masks.

Accordingly, it is possible to realize a reduction in total exposure processing time and a decrease in superimposition error.

Yet another embodiment of the present invention will be described below. This embodiment provides a fabricating method for an exposure mask which takes into account the flare amount of the optical system of an exposure apparatus. When an exposure mask according to any of the above-mentioned embodiments is actually fabricated by way of experiment and a photoresist is formed into a predetermined three-dimensional structure (such as a lens array), there is a case where an error occurs in the formation height of a peripheral portion of a lens as shown in the graph of FIG. 18(c) by way of example.

The error has a tendency to become large in formation height at a location where the mask pattern opening size is small, i.e., the mask transmittance is small. A main possible cause is that when a large exposure amount is given by the exposure apparatus, an unexpected "fog exposure" occurs under the influence of flare in the exposure apparatus, so that DC component-like exposure amounts occur over the entire exposure field.

Figure 18:
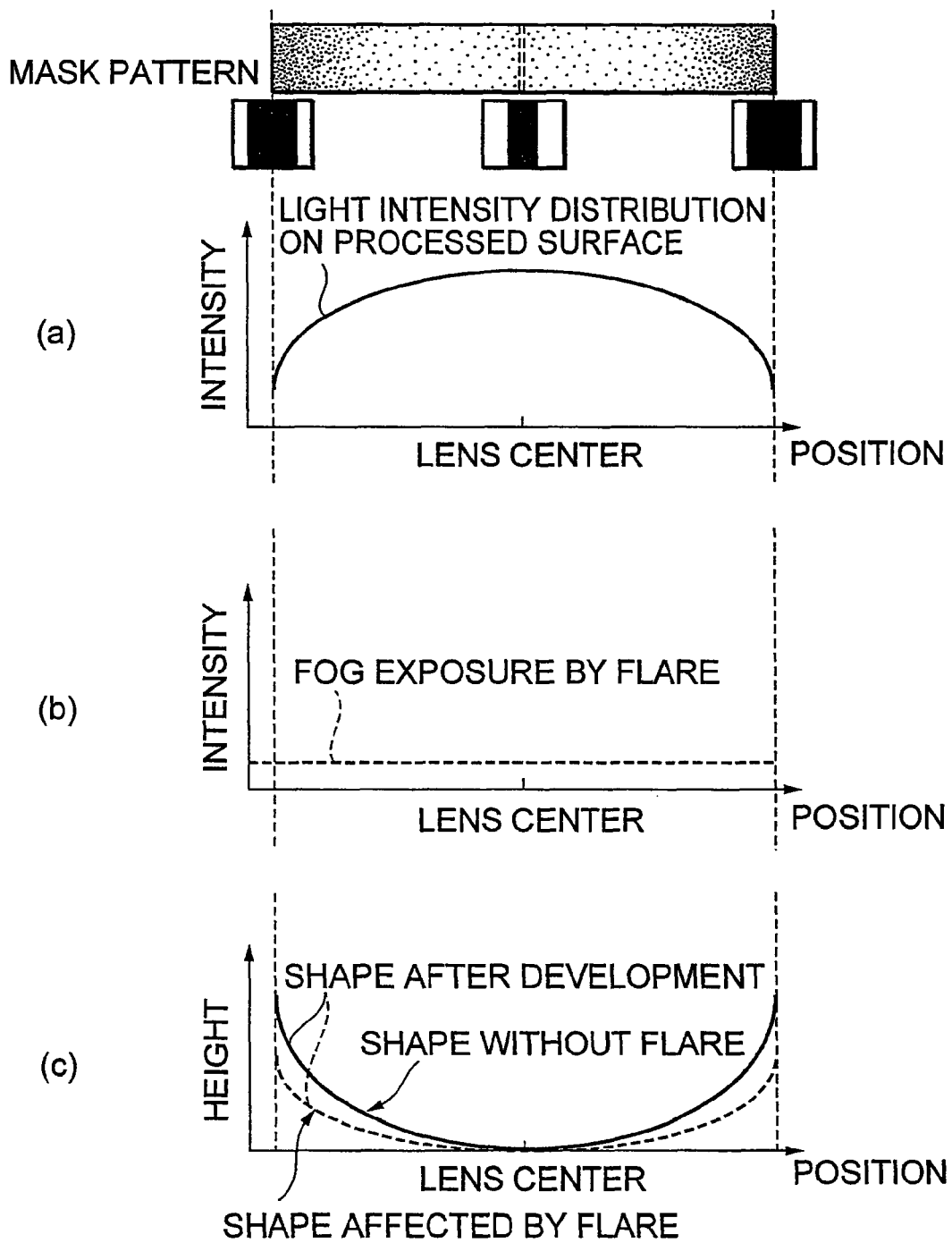
FIG. 18 is an explanatory schematic view of the influence of flare.

The impact of this flare on surface accuracy in the formation of a lens array will be described with reference to the conceptual diagram of FIG. 18. In the case where, for example, a one-dimensional concave lens array shape is formed from a positive resistive, as shown in FIG. 18(a), the light intensity is largest at the lens center, and the light intensity becomes smaller from the lens center toward the periphery (boundary). Accordingly, the transmittance of the exposure mask, i.e., the pattern opening ratio thereof, becomes smaller from the lens center toward the periphery.

If a far larger resist processing depth is to be obtained, the range of transmittance of the mask needs to be made larger. In the case of one-dimensional lens formation, the transmittance of the mask may be a maximum of 70% to 80% and a minimum of several %.

On the other hand, the flare in the exposure amount is a phenomenon which occurs owing to the surface roughness of the polished surfaces of lenses which constitute the optical system as well as because anti-reflection layers coated on the lenses do not have completely zero reflectances, and lights reflected from various surfaces including the mask are subjected to multiple diffuse reflection and reach an image-forming plane as so-called stray light. When flare is present, stray light which can be regarded as a uniform DC component is present on the wafer surface (refer to FIG. 18(b)). It is said that even an exposure apparatus for use in semiconductor fabrication has 3% to 4% flare.

Figure 19:
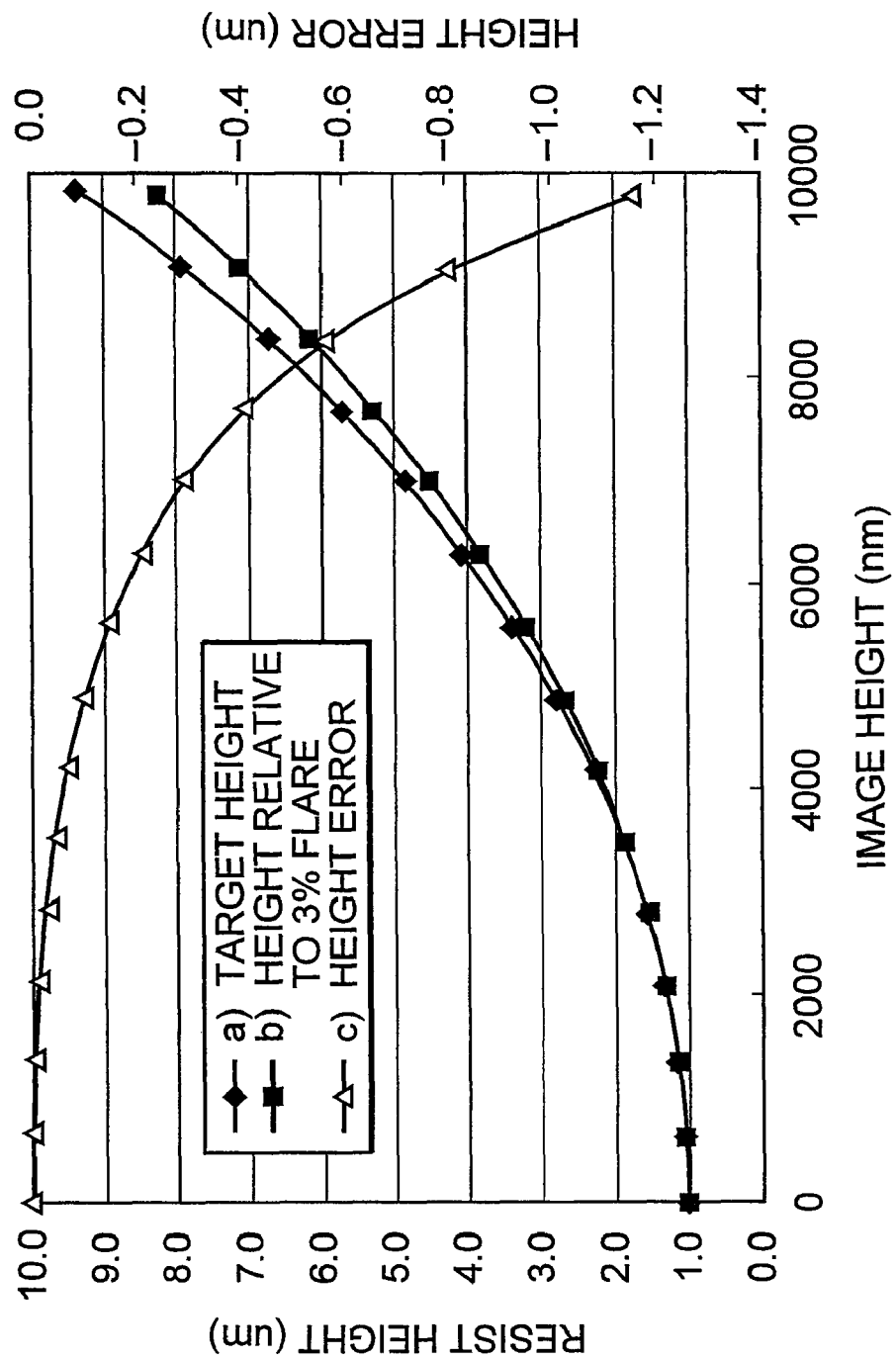
FIG. 19 is an explanatory view of resist heights (shape errors) due to flare.

Namely, the amount of flare is at the same level as the minimum value of the above-mentioned mask transmittance, and the influence of unexpected flare on exposure amounts becomes remarkable in the peripheral portion of the lens. A specific estimation example of this shape error is shown in FIG. 19. The respective data shown in FIG. 19 use resist contrasts and lens design values which will be described later, and are as follows:

a) target lens shape (0% flare),
b) lens shape relative to 3% flare (calculated value),
c) lens shape error (height error)→right axis.

As shown, the lens is formed to be 1.2 um lower than its design height at its outermost periphery under the influence of 3% flare. As one example, if it is assumed that the target shape of a lens is a one-dimensional concave lens array and the shape is expressed by an aspherical equation and that its radius of curvature (R)=7 um and its lens size is 19.6 um, this indicates that its conic constant approximately becomes $k \cong -0.875$ with respect to a design value of $K=-0.7$, so that deviations from the design values of various kinds of optical performance of the lens become unignorable.

Figure 20:
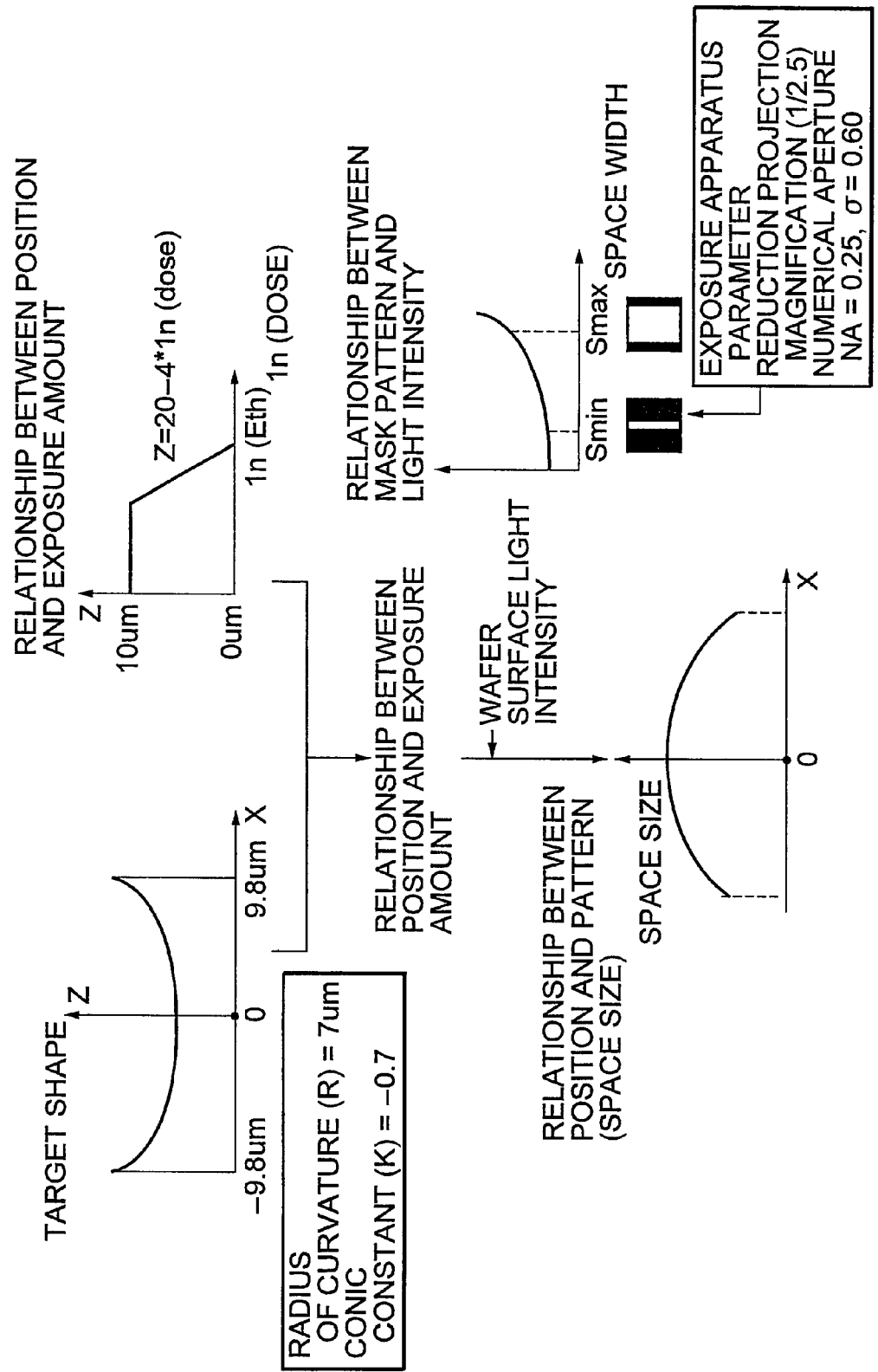
FIG. 20 is an explanatory schematic view of a fabrication method for an exposure mask.

This embodiment is characterized by taking into account the influence of flare in the pattern design of exposure masks. FIG. 20 is an explanatory schematic view of a fabrication method for an exposure mask according to the present embodiment. It is assumed that the amount of flare is known by being quantitatively measured by a method which will be described later in the embodiment (refer to International Publication WO2002-009163 (Japanese Patent Application No. 2002-514774), SPIE VOL. 3051 (1997) P708-P713, Measuring Flare and Its effect on Process Latitude).

In addition, in the pattern design of the mask, it is assumed that an effective exposure amount at each position on the mask is the sum of transmitted light from the mask and flare which is a DC component. A mask transmittance at each position is set so that this effective exposure amount can provide the desired lens shape.

In this embodiment, as one example, it is assumed that the target shape of a lens to be handled is a one-dimensional concave lens array and the shape is expressed by an aspherical equation and that the lens has an aspherical surface of radius of curvature (R)=7 um and conic constant (k)=−0.7 and its lens size is 19.6 um. In this case, the sag amount of the lens is 8.3 um. The aspherical equation is assumed to be expressed by the above-mentioned Equation 7. In Equation 7, r represents the distance from the lens center, and c represents a curvature which is the reciprocal of a radius of curvature.

The contrast of a resist to be used is measured in advance, and its film thickness during its initial unexposed state is 10 um. With respect to an exposure amount (E), a resist height (Z) after development is expressed as $Z=20-4\times\ln(E)$ (refer to the relationship between exposure amount and remaining film thickness in FIG. 20).

An exposure apparatus to be used has a numerical aperture (NA)=0.25 and a coherence factor ($\sigma$)=0.6 (refer to the exposure apparatus parameters shown in FIG. 20). At this time, the maximum value of non-imaging pitches derived from Equation 1 is 912.5 nm. Therefore, in the case of this embodiment, the pattern pitch is set to 700 nm which is 1/an integer of an entire lens size of 19.6 um.

If it is assumed that the reduction projection magnification of the exposure apparatus is 1/2.5 times and the minimum mask size value is 400 nm on the mask, the value is 160 nm on the wafer surface. Therefore, a mask pattern can be formed in the range of space sizes 160 nm to 540 nm at a pitch of 700 nm.

Under these conditions, the reference of the pattern is determined so that a maximum transmittance of 0.595 at the lens center can be obtained at a hole pitch of 700 nm with a hole size of 540 nm, whereby pattern design is performed so that the desired lens shape is obtained after development.

An actual example of pattern design according to the present embodiment will be described below with reference to the flowchart of FIG. 21. In the present embodiment, as to dry etching after formation of a resist shape, a description will be given on the assumption that the conversion difference is zero, for the sake of simplicity. Namely, it is assumed that a resist shape=a lens shape after etching. By way of example, the above-mentioned processing conditions shown in FIG. 20 are used as processing conditions such as target lens shape, resist contrast and parameter of the exposure apparatus.

[Step 11 and Step 12]

First, the flare amount is specified. This is assumed to be approximately calculated and quantified by the above-mentioned known technique. In these steps, it is assumed that the flare is 3%. The flowchart proceeds to the following description.

[Step 13]

Then, an exposure amount (Ei) for obtaining a target height (Z) at each position (image height) is calculated. In this step, it is assumed that the contrast curve of the resist is $Z=20-4\times\ln(E)$ as previously assumed, and the objective lens shape is a one-dimensional lens having an aspherical surface of radius of curvature (R)=7 um and conic constant (k)=−0.7 as well as a lens size of 19.6 um.

[Step 14]

A mask transmittance for obtaining the exposure amount (Ei) at each position is calculated. First, in this step, a 1 um thick resist is left because, as described previously, it is preferable to form a resist shape with a slight film thickness left even at a location where its film thickness becomes smallest. From the previously set contrast curve ($Z=20-4\times\ln(E)$) of the resist, an exposure amount which provides a remaining film thickness of 1 um without a pattern is calculated as 116[mJ/cm$^2$]. In this embodiment, the setting of the exposure amount is performed by setting conditions for an exposure amount which allows the remaining film to become 1 μm thick at the lens center (zero image height)(Eset). Since the mask pattern at a position of zero image height has a maximum space size of 540 nm, the theoretical value of mask transmittance at this time is 60%. When this 60% and 3% of flare are added together, an exposure amount which is 63% of the set exposure amount (Eset) is effectively given, and the set exposure amount (Eset) becomes 185[mJ/cm$^2$] from the following equation:

(exposure amount for providing remaining film thickness of 1 um=116*[mJ/cm$^2$]*)/(0.60+0.03)=185 *[mJ/cm$^2$]*.

[Step 15]

Then, a mask transmittance ($T_{abs}(X)$) for obtaining a target exposure amount (E(X)) at each position is calculated from the following equation:

$$E\,\text{set}*(T_{abs}(X)+\text{flare})=E(X)$$

[Step 16]

Finally, a space pattern size S(X) for obtaining this mask transmittance ($T_{abs}(X)$) is calculated from the following equation. In this equation, X is the central coordinate values of a space pattern, and takes on discrete values of X=mP (m is zero or a positive/negative integer). Specific results of this calculation are shown in FIGS. 22A and 22B.

$$S(X)=Px[T_{abs}(X)]^{1/2}$$

Figures 22A, 22B:
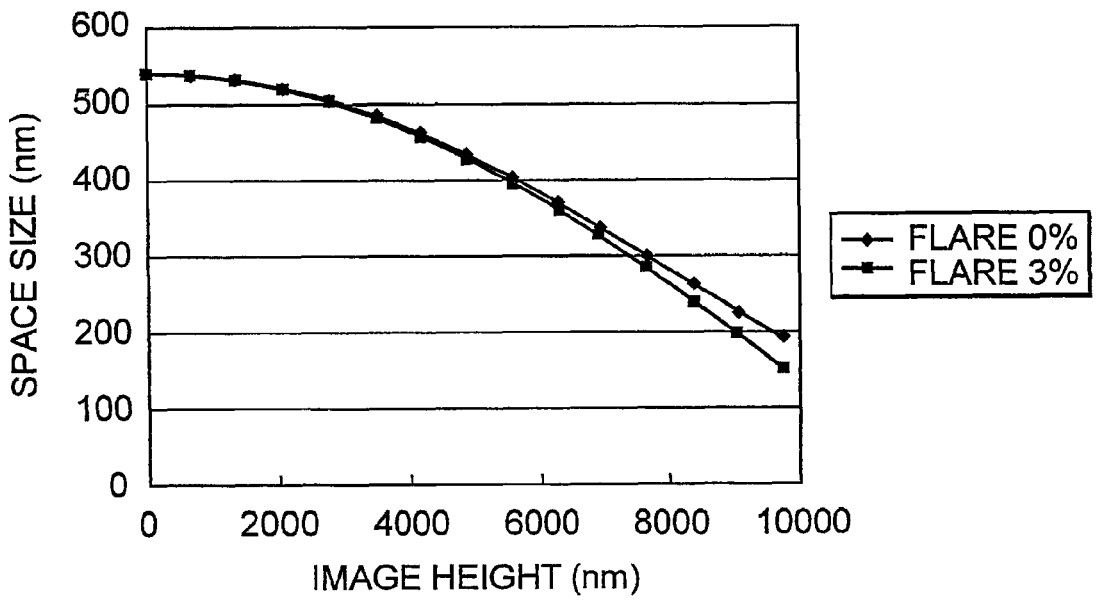
FIGS. 22A and 22B are views showing specific calculated results.

FIGS. 22A and 22B show mask pattern solutions relative to 0% flare and 3% flare, and FIG. 22A shows a graph, while FIG. 22B shows numerical examples. From these figures, it is possible to see the difference between the mask pattern solutions based on the difference between the amounts of flare.

These amounts of flare are calculated in advance and an exposure amount including the flare amounts and light transmitted through the mask is found as an effective exposure amount, and a mask pattern designing method which enables the desired resist shape to be obtained from this effective exposure amount can be adopted to eliminate the global errors of the resist shape.

In the present embodiment, reference has been made to one-dimensional pattern formation, but even in two-dimensional pattern formation using the above-mentioned contact hole patterns or island patterns, similar advantages can be achieved by adopting similar techniques.

Figure 23A:
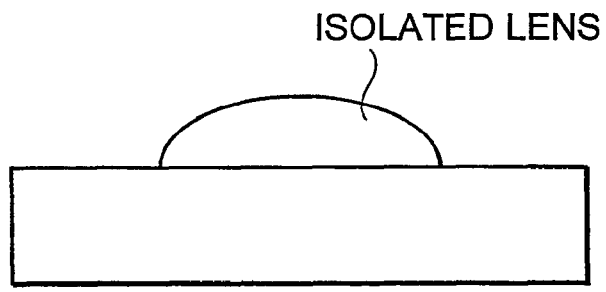
FIGS. 23A and 23B are explanatory schematic views of an isolated lens.
Figure 23B:
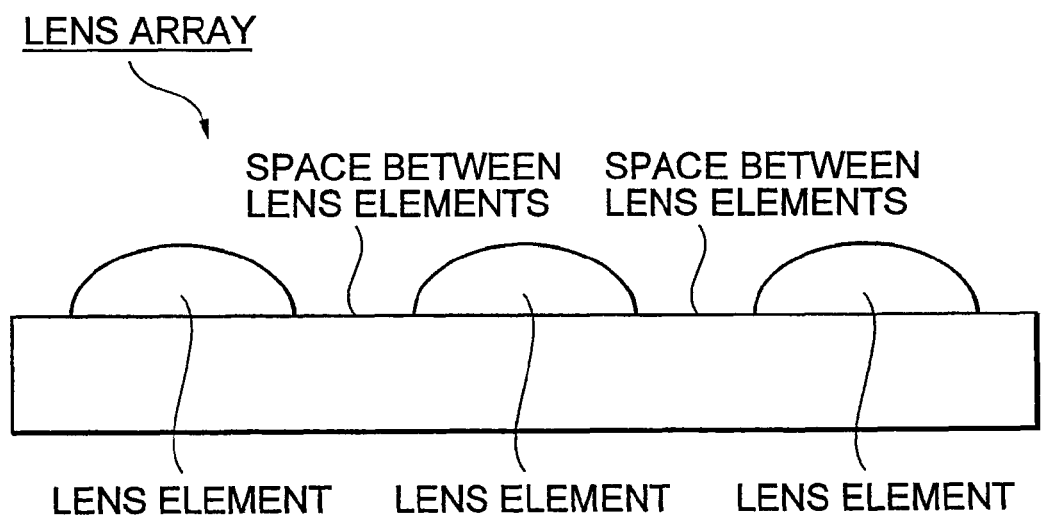

An example of the case where an isolated lens (refer to FIG. 23A) or a lens array in which a space lies between lens elements which are not completely continuous (refer to FIG. 23B) will be described below.

Namely, the above description has referred to methods of designing mask patterns for forming lens arrays, but if an isolated lens or a lens array having lens elements with a space lying there between is to be formed, the same pattern as an outermost lens periphery needs to be arranged as the pattern of a lens periphery.

Figure 24A:
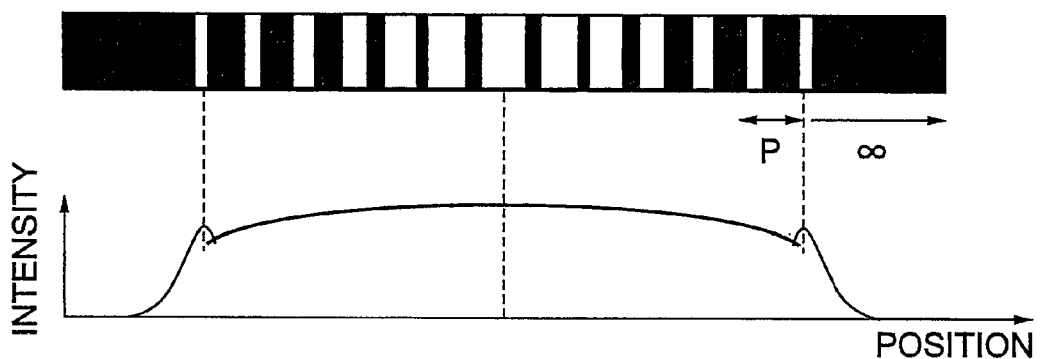
FIGS. 24A and 24B are explanatory schematic views of a lens array in which a space lies between lens elements.

In the case of a mask according to the present invention, light intensity at one point on a wafer to be exposed, i.e., light transmittance, is controlled on the basis of a pattern for at least two pitches, and as shown in FIG. 24A by way of example, in a mask pattern arrangement at the outermost lens periphery, if a pitch P is ensured on one side but an infinite pitch (isolation) lies on the other side, the other side does not satisfy non-imaging conditions (Equation 1). Therefore, partial image formation occurs, so that ripple noise is produced in light intensity. Accordingly, the surface accuracy of a resist shape which is an intermediate product is remarkably degraded.

Figure 24B:
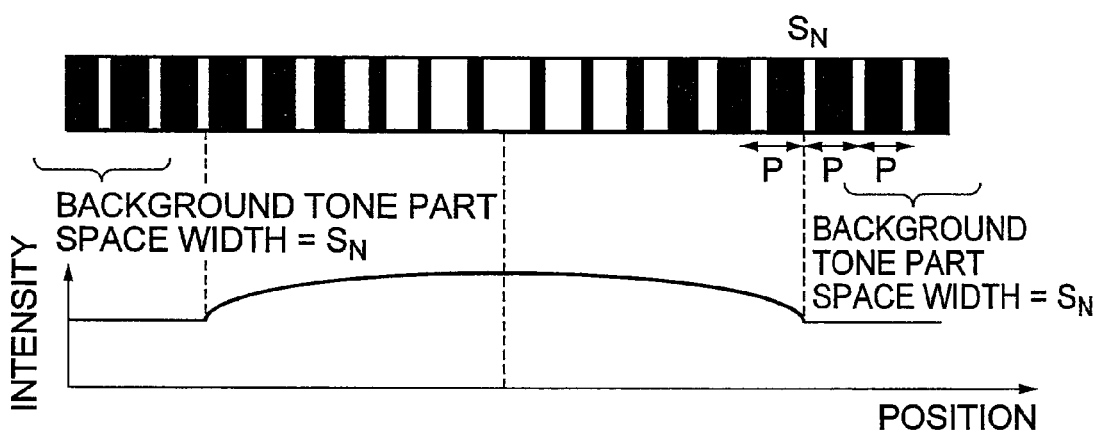
Figure 25:
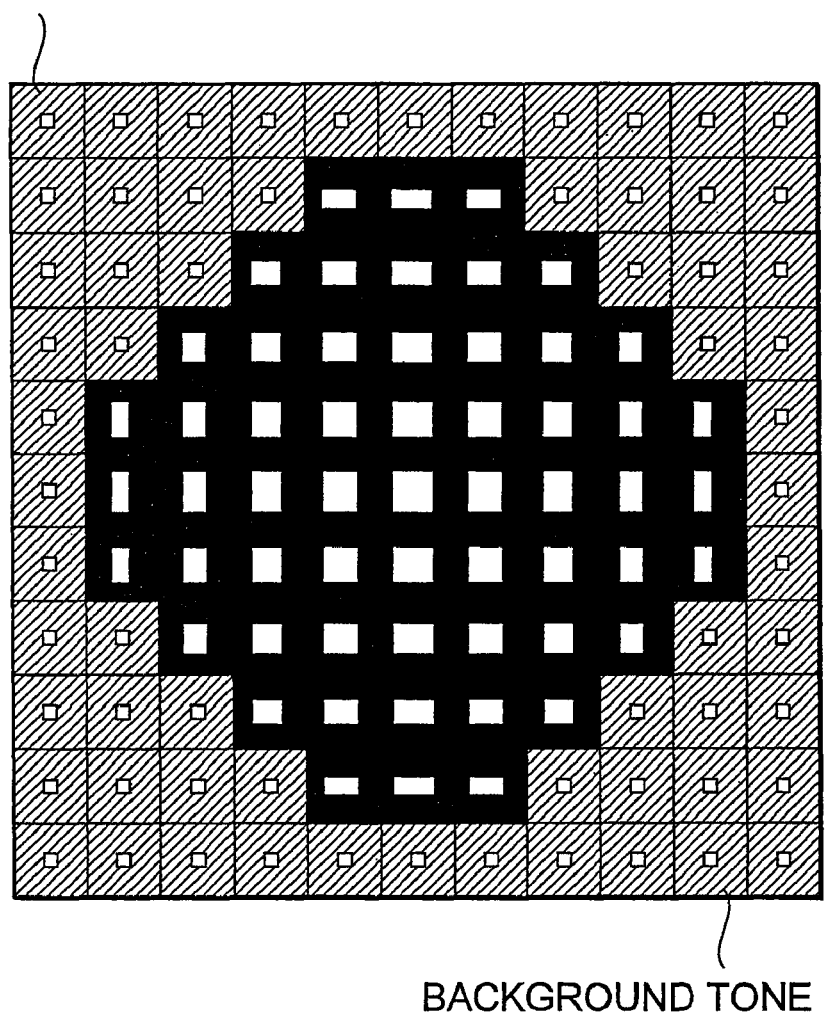
FIG. 25 is an explanatory schematic view of patterns corresponding to the outermost lens periphery.

To avoid this, the same pattern as the mask pattern of the outermost lens periphery or edge (the ratio of a light blocking pattern to a transmissive pattern which are formed within a space size $S_N$) is arranged as a background tone forming pattern (a peripheral pattern). One- and two-dimensional examples each including this peripheral pattern are shown in FIGS. 24B and 25, respectively. The background tone parts shown in each of FIGS. 24B and 25 correspond to peripheral patterns, respectively. The hatched portions of FIG. 25 conceptually show the light blocking parts of the respective peripheral patterns (background tone parts), and are chromium light blocking parts which are 0% transmissive.

Figure 26:
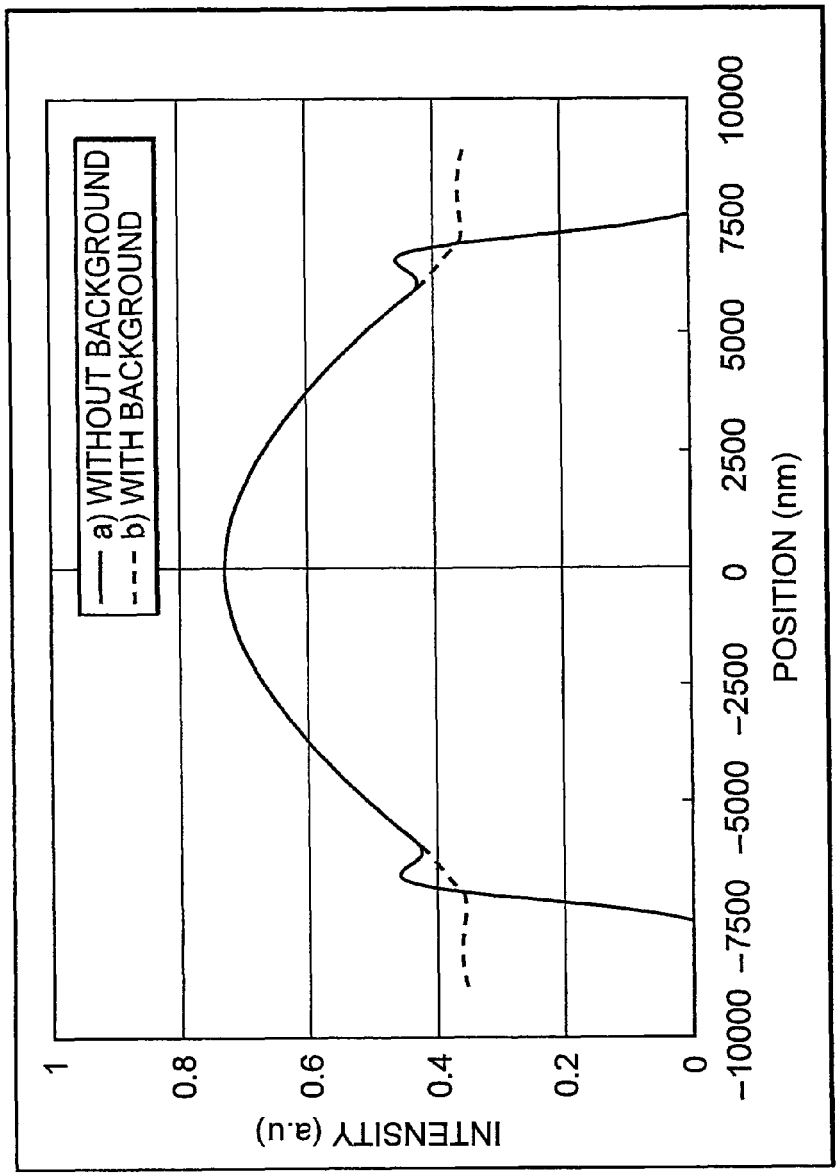
FIG. 26 is an explanatory view of an exposure result of pattern design which takes background tones into account.

According to this pattern arrangement, it is possible to minimize the occurrence of ripples in light intensity at the outermost lens periphery or edge. FIG. 26 shows an example of light intensity simulation in pattern design for forming a specific one-dimensional isolated lens, and it can be seen that ripples are suppressed at the outermost lens periphery by a pattern arrangement which takes into account background tones.

A method of fabricating a microlens array with an exposure mask according to the present invention will be described below with reference to the schematic views of FIGS. 27A to 27C. First, a substrate made of, for example, a quartz glass wafer of diameter 6 inches is coated with a photoresist (hereinafter referred to simply as "resist") which is a photosensitive material. The coating thickness is, for example, approximately 10 um (refer to FIG. 27A).

Then, a stepper which is one type of exposure apparatus is made to radiate i-line light to expose the resist via the mask of the present embodiment. In this step, an alignment mark which is to be necessary in a later step is also formed at the same time. After exposure, the resist is developed, whereby a three-dimensional shape set by the mask can be transferred to the resist (refer to FIG. 27B).

Then, the substrate is dry-etched via this resist. In this manner, the three-dimensional shape of the resist is transferred to the substrate. After that, the quartz substrate to which the three-dimensional shape has been transferred is coated with a resin having a high refractive index by spin coating or the like. In this manner, a plus power lens array made of the resin corresponding to the three-dimensional shape of the substrate is formed (refer to FIG. 27C).

Figure 28:
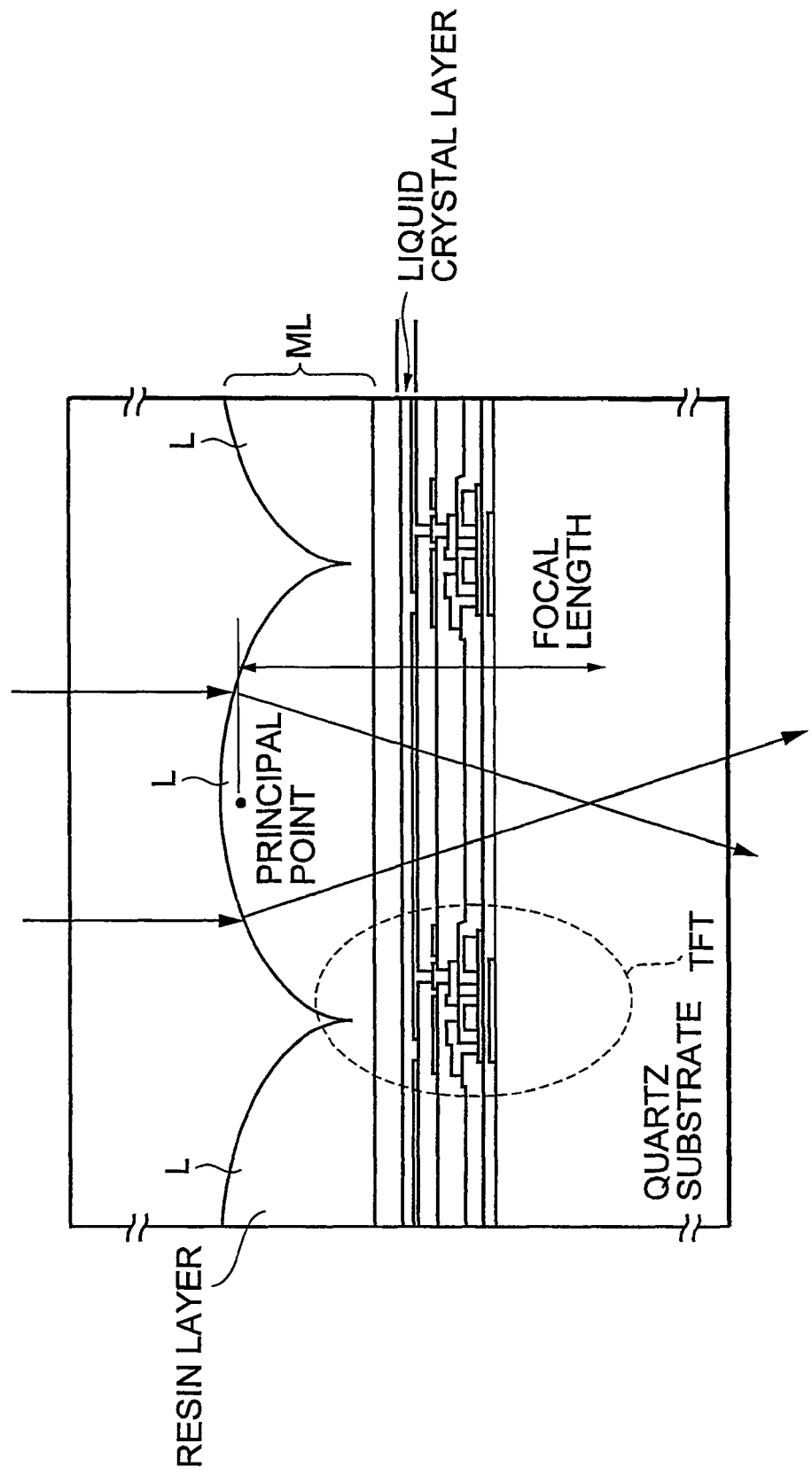
FIG. 28 is an explanatory schematic view of an apparatus to which a microlens array is applied.
Figure 29:
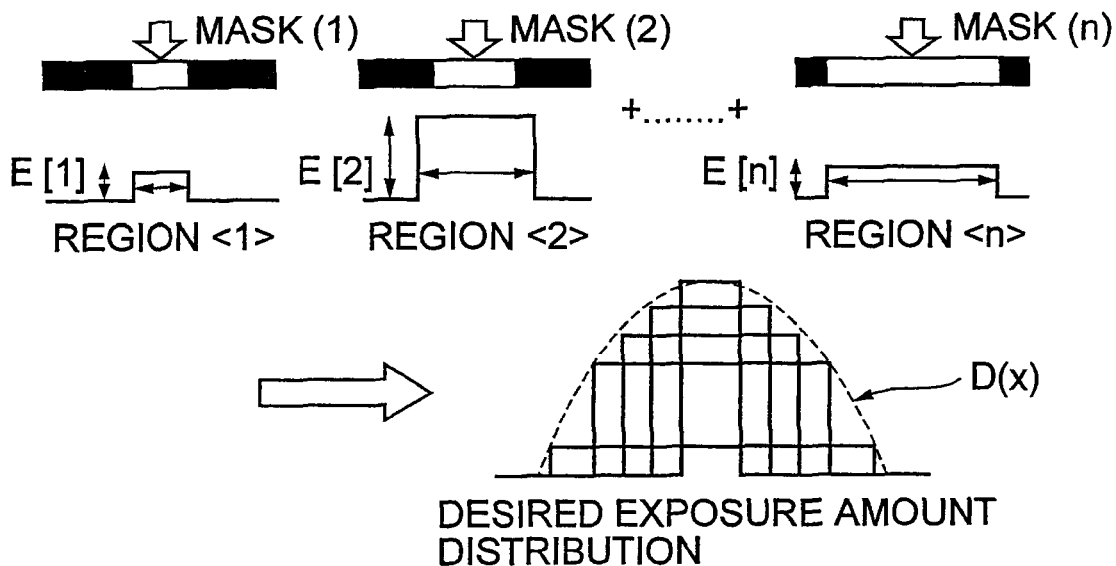
FIG. 29 is an explanatory schematic view of an example of multiple exposure.
Figure 30:
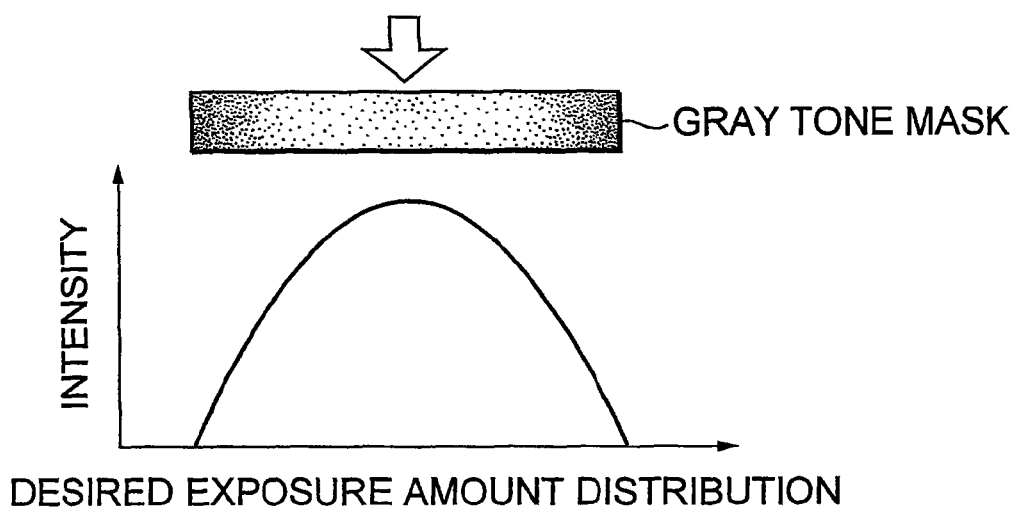
FIG. 30 is an explanatory conceptual diagram of a gray-tone mask.

This microlens array is applied to the apparatus shown in FIG. 28. The apparatus shown in FIG. 28 is a liquid crystal projector, and includes TFTs (Thin Film Transistors) formed on its quartz substrate and a liquid crystal formed on the TFTs, and controls the orientation of its liquid crystal layer in units of pixels by the driving of the TFTs.

In a microlens array ML formed with the mask according to the present embodiment, individual lenses L are formed of a resin layer to correspond to the respective pixels of the liquid crystal projector. According to the mask of the present embodiment, it is possible to form the microlens array ML through one exposure, and the mask itself can be easily fabricated because the mask is a binary mask made of a combination of light blocking patterns and transmissive patterns. Accordingly, the microlens array ML to be applied to the liquid crystal projector can be inexpensively provided, and the cost of the liquid crystal projector can be reduced.

As mentioned previously, the shape of each of the lenses L to be formed can be freely set according to the ratio or arrangement of a light blocking pattern and a transmissive pattern, and an accurate lens shape can be reproduced by setting a mask exposure amount which makes good use of the development characteristics of the resist. Accordingly, it is possible to provide the lenses L of high accuracy without producing unnecessary seams at the boundaries between the individual lenses L.

It is to be noted that the above-mentioned microlens array fabrication method uses an example in which after a three-dimensional photoresist shape has been formed, a substrate is processed by etching, but it is also possible to mass-produce microlens arrays by a stamper method using a more inexpensive resin or the like as a material, by electroforming a photoresist into a mother mold. In addition, the lens array formed with the mask of the present embodiment can be applied not only to the liquid crystal projector but also to CCDs, other liquid crystal apparatus, semiconductor lasers, photosensitive devices and optical communication equipment. In addition, the present embodiment can also be applied to the fabrication of three-dimensional shapes other than lenses.

Industrial Applicability

The present invention can be applied to switches, relays and sensors using MEMS (Micro Electro Mechanical System) or NEMS (Nano Electro Mechanical System). Further, the present invention can be applied to the formation of the base shapes of substrates into arbitrary shapes in semiconductor fabrication and the like.

The invention claimed is:

1. A method for making an exposure mask used with an exposure apparatus, said method comprising the steps of:
 calculating an exposure amount distribution for a photosensitive material using design data of a three-dimensional shape, said exposure amount distribution being calculated by (i) adding a flare amount of an optical system of an exposure apparatus to an effective exposure amount and (ii) calculating a transmittance distribution of said exposure mask based on said exposure amount distribution;
 calculating a first pitch in a first direction and a second pitch in a second direction using optical conditions of said exposure apparatus;
 arranging a plurality of pattern blocks to form said exposure mask with each pattern block having a blocking pattern and a light transmissive pattern, whereby an area ratio of said light blocking pattern to said transmissive pattern can vary, the pattern blocks having a first constant size in the first direction and a second constant size in the second direction; and arranging a projection magnification lens in-between a photosensitive material and said exposure mask, wherein, said first and second pitches are values whose minimums are represented by the relationship: $Pmin \leq \lambda/(NA \times (1+\sigma))$, Pmin is a minimum pitch, $\lambda$ is an exposure wavelength, NA is a numerical aperture of the exposure apparatus, $\sigma$ is a coherence factor, said first and second pitches are the same value or different values, said plurality of pattern blocks are contiguously arranged (a) in a first direction at said first pitch in said first direction and (b) in a second direction at said second pitch in said second direction, and said area ratio of said light blocking pattern to said transmissive pattern varies with location as a function of a continuous variable.

2. The method of claim 1, wherein said flare amount being quantified by performing an overexposure with a known pattern of light transmittance and obtaining an amount of exposure by which said overexposure removes remaining resist films.

3. An exposure mask to be used with an exposure apparatus to create a three-dimensional shape, said exposure mask comprising:

a plurality of pattern blocks, each pattern block having a blocking pattern and a light transmissive pattern, whereby an area ratio of said light blocking pattern to said transmissive pattern can vary among the pattern blocks, the pattern blocks having a first constant size in the first direction and a second constant size in the second direction, wherein, said plurality of pattern blocks are arranged contiguously in a first direction at a first pitch in said first direction and contiguously in a second direction and having at a second pitch in said second direction, said first and second pitches are values whose minimums are represented by the relationship: $Pmin \leq \lambda/(NA \times (1+\sigma))$, Pmin is a minimum pitch, $\lambda$ is an exposure wavelength, NA is a numerical aperture of the exposure apparatus, $\sigma$ is a coherence factor, said first and second pitches are the same value or different values, an area ratio of said light blocking pattern to said transmissive pattern can vary, said area ratio of said light blocking pattern to said transmissive pattern varies with location as a function of a continuous variable, and a periphery pattern adjacent to and outside of said continuous pattern block comprises a second light blocking pattern and a second transmissive pattern, said second light blocking pattern and said second transmissive pattern having an area ratio identical to a corresponding ratio at an outermost edge of said contiguous pattern blocks.

4. A method for making an exposure mask used with an exposure apparatus, said method comprising the steps of:

calculating an exposure amount distribution for a photosensitive material using (i) design data of said three-dimensional shape, and (ii) an etching conversion difference in a resist shape before and after etching;

calculating a transmittance distribution of said exposure mask based on said exposure amount distribution;

calculating a first pitch in a first direction and a second pitch in a second direction using optical conditions of said exposure apparatus;

arranging a plurality of pattern blocks to form said exposure mask with each pattern block having a light blocking pattern and a light transmissive pattern, whereby an area ratio of said light blocking pattern to said transmissive pattern can vary among the pattern blocks, the pattern blocks having a first constant size in the first direction and a second constant size in the second direction; and arranging a projection magnification lens in-between a photosensitive material and said exposure mask, wherein, said first and second pitches are values whose minimums are represented by the relationship: $Pmin \leq \lambda/(NA \times (1+\sigma))$, Pmin is a minimum pitch, $\lambda$ is an exposure wavelength, NA is a numerical aperture of the exposure apparatus, $\sigma$ is a coherence factor, said plurality of pattern blocks are contiguously arranged (a) in a first direction at said first pitch in said first direction and (b) in a second direction at said second pitch in said second direction, said area ratio of said light blocking pattern to said transmissive pattern varies with location as a function of a continuous variable, and said first and second pitch are the same value or different values.

5. The method of claim 4, wherein said etching conversion difference is selected from values depending on a height of said photosensitive material before etching and being represented in a function or a table.

* * * * *